(12) United States Patent
Gautam et al.

(10) Patent No.: US 11,551,768 B2
(45) Date of Patent: Jan. 10, 2023

(54) READ AND VERIFY METHODOLOGY AND STRUCTURE TO COUNTER GATE $SIO_2$ DEPENDENCE OF NON-VOLATILE MEMORY CELLS

(71) Applicant: SanDisk Technologies LLC, Addison, TX (US)

(72) Inventors: Rajdeep Gautam, Yokohama (JP); Akira Okada, Yokohama (JP)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 17/091,834

(22) Filed: Nov. 6, 2020

(65) Prior Publication Data

US 2022/0148665 A1    May 12, 2022

(51) Int. Cl.
  *G11C 16/30* (2006.01)
  *G11C 16/34* (2006.01)
  *G11C 16/26* (2006.01)
  *G11C 16/20* (2006.01)

(52) U.S. Cl.
  CPC .......... *G11C 16/3459* (2013.01); *G11C 16/20* (2013.01); *G11C 16/26* (2013.01); *G11C 16/30* (2013.01)

(58) Field of Classification Search
  CPC ...... G11C 16/3459; G11C 16/20; G11C 16/26; G11C 16/30
  See application file for complete search history.

(56) References Cited

U.S. PATENT DOCUMENTS

| | | | |
|---|---|---|---|
| 8,982,626 B2 | 3/2015 | Dong et al. | |
| 8,982,637 B1 | 3/2015 | Dong et al. | |
| 9,330,778 B2 | 5/2016 | Costa et al. | |
| 9,812,462 B1 | 11/2017 | Pang et al. | |
| 10,665,301 B1 | 5/2020 | Lu et al. | |
| 2017/0069390 A1* | 3/2017 | Nam | G11C 16/10 |

* cited by examiner

*Primary Examiner* — Xiaochun L Chen
(74) *Attorney, Agent, or Firm* — Dickinson Wright PLLC; Steven C. Hurles

(57) ABSTRACT

A method for programming a target memory cell in a memory array of a non-volatile memory system, the method comprising defining a default read biasing voltage value and a default verify biasing voltage value for each program state of a target memory cell of a memory structure, determining a location of a target memory cell within the memory structure and, based upon the determined location of the target memory cell, applying a first incremental offset voltage to the default read biasing voltage value with respect to each program state, and applying a second incremental offset voltage to the default verify biasing voltage value with respect to each program state.

20 Claims, 17 Drawing Sheets

*FIG. 15*

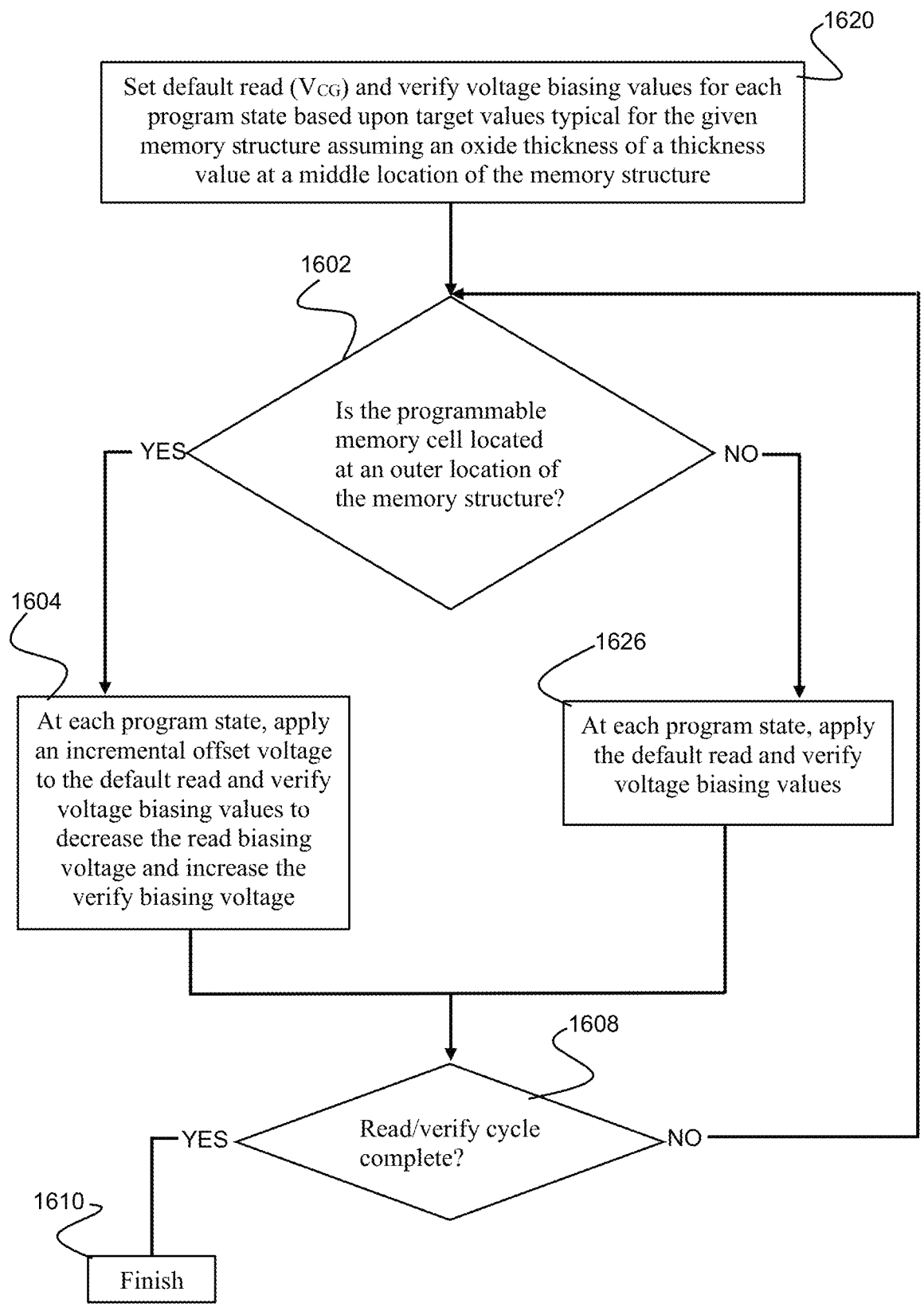
FIG. 16-A

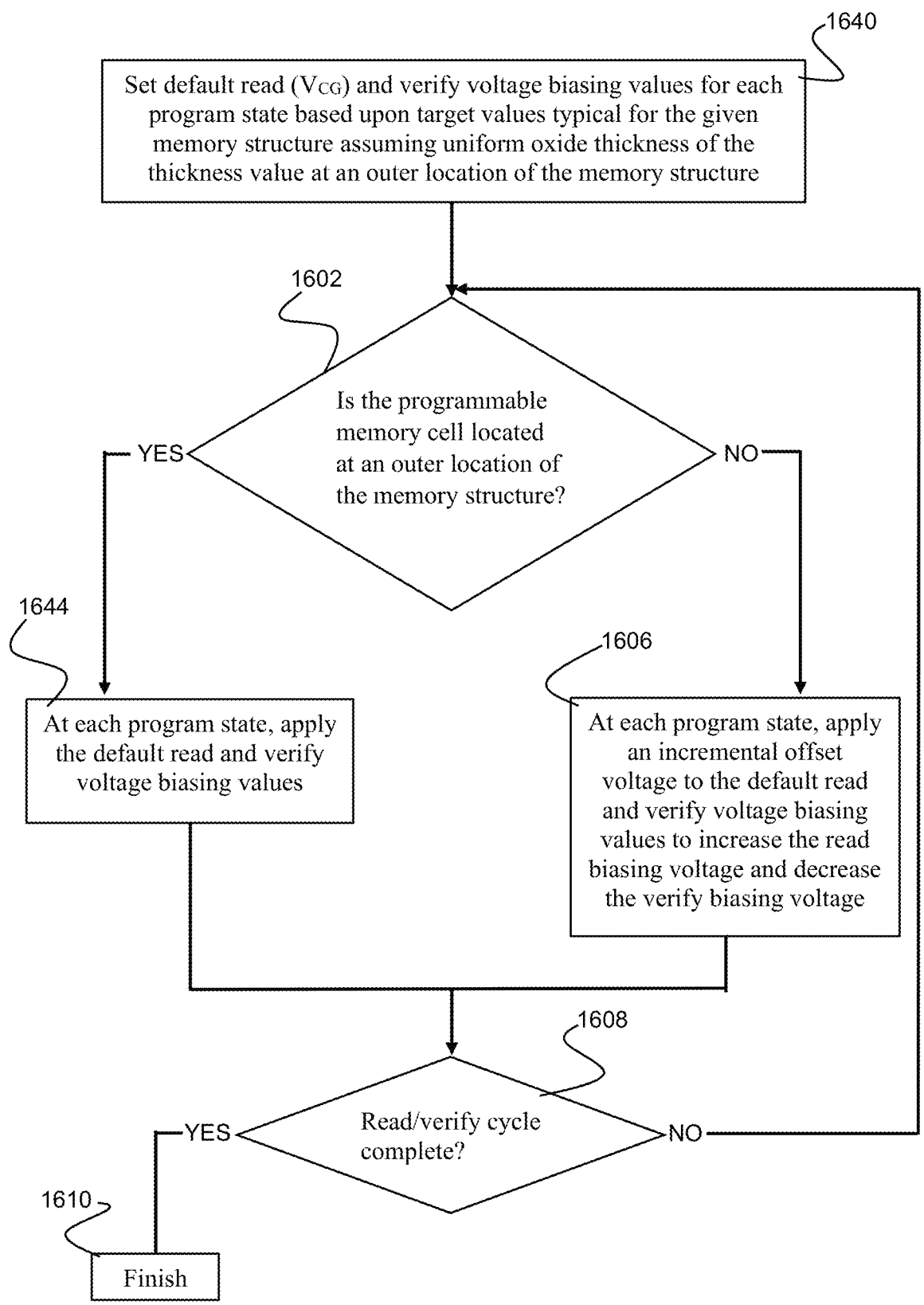
FIG. 16-B

READ AND VERIFY METHODOLOGY AND STRUCTURE TO COUNTER GATE SIO₂ DEPENDENCE OF NON-VOLATILE MEMORY CELLS

TECHNICAL FIELD

This disclosure relates to non-volatile memory storage systems in solid-state drives or other devices, including but not limited to flash drives or embedded/removable flash packages. More specifically, this disclosure relates to systems and methods for, during program verify and read operations, predictively compensating for the deleterious effects of fluctuations in electrical resistivity resulting from variations in the oxide material thicknesses between individual storage elements of the memory.

BACKGROUND

Due to emerging technology and market forces, solid-state drives (SSDs) are steadily replacing previously conventional data storage systems that rely on the rotation of magnetic mediums for reading and writing data (e.g., hard disk drives). Rather than comprising any mechanical or moving parts, solid-state memory comprises integrated circuit assemblies or interconnected flash components to provide non-volatile storage in which stored data can be persistently retained even during a planned or unplanned interruption of power. As a result, a solid-state drive is inherently faster and more robust (i.e., less susceptible to data loss and corruption), as well as consumes less power and is more compact in comparison to disk-based storage. Accordingly, non-volatile memory is a powerful storage solution with respect to many types of computing, consumer electronic, and stand-alone external storage (e.g., USB drives) devices. Advances in non-volatile memory structures have led to significant increases in their storage density capability and a reduction in their power consumption, thereby lowering the per-bit and bit-per-chip cost.

Generally, a non-volatile memory device may be comprised of one or more arrays of individual memory cells. With respect to some flash memory types, each memory cell is comprised of a floating gate that is positioned above and isolated from a channel region of a semiconductor substrate, wherein the floating gate is positioned between the source and drain regions. Also, a control gate is provided over and isolated from the floating gate, wherein a threshold voltage ($V_{th}$) of the memory cell transistor is controlled by and dependent upon the amount of charge that is retained on the transistor's floating gate. Specifically, in a switch-like manner, a minimum amount of voltage that must be applied to the control gate of the transistor before the transistor is activated to permit conduction between its source and drain regions is, therefore, determined by the level of charge being retained on the floating gate. As a result, bit-value data can be programmed onto and erased from the cell by precisely changing the level of charge on the floating gate in order to change the threshold voltage ($V_{th}$) characteristic of the transistor. In an array structure, the memory cells are addressable by word lines (rows) and bit lines (columns). One type of non-volatile memory storage defined by this general structure is referred to as NAND flash memory based upon its electrical characteristics, which resemble a NAND logic gate.

As explained in detail below, the number of bits that can be stored in an individual memory cell is dependent upon the number of distinct voltage ranges that may be partitioned within the threshold voltage ($V_{th}$) window of that memory cell. For example, to store one bit of data (referred to as a binary data), the possible threshold voltage ($V_{th}$) of a memory cell can be divided into two voltage ranges, wherein the ranges are assigned as logical data "1" and "0" respectively. Accordingly, a memory cell of this storage density order may be referred to as a "single-level cell" or SLC.

By further partitioning the threshold voltage ($V_{th}$) window of a memory cell into additional distinct voltage ranges, multiple levels of information may be stored. A memory cell of this storage density order may be referred to as a "multi-state cell" or MLC. For example, in order to store two bits of data, the threshold voltage ($V_{th}$) window of a cell can be further partitioned into four distinct voltage ranges, with each range assigned a bit value equal to, for example, "11," "10," "01," and "00." Accordingly, following an erase operation, the cell's threshold voltage ($V_{th}$) is negative, which could be defined as logic "11." As such, the positive threshold voltages ($V_{th}$) can be used for the programmed states of "10," "01," and "00." In a further example, to store three bits of data, the threshold voltage ($V_{th}$) window of a cell may be partitioned into eight distinct voltage ranges, with each range assigned a bit value equal to, for example, "111," "110," "100," "010," "011," "000," "001," and "101." A memory cell of this storage density order may be referred to as a "tri-level," "triple-level cell," or TLC.

The specific relationship between the data programmed into a memory cell and the threshold voltage ($V_{th}$) levels of the memory cell depends on the data encoding pattern or data scheme adopted for the memory cells.

Thus, a memory device that comprises multi-state data (by incorporated MLC and/or TLC-type cells) has an increased storage capacity using the same MOSFET structure and wafer size as a memory device having a lower storage density (e.g., by incorporating SLC-type cells) and, therefore, provides a comparative cost per bit savings. However, as a consequence of the increased density, the tolerances between the partitioned voltage ranges of multi-state memory cells tighten and programming occurs at a slower speed relative to a single-state memory cell because the data is programmed to multiple target threshold voltage ($V_{th}$) ranges and requires a higher level of precision during programming. The increased storage density of a multi-state memory cell decreases the available margin of error between state changes and reduces the available voltage range capacity needed to endure the stress on the silicon oxide layer over successive programming/erase cycles. As a result, in comparison to a single-state cell, the durability of a multi-state storage element is significantly less.

In addition to the increasing storage densities with respect to a single memory cell, advances in non-volatile memory array structures have led to memory cells being stacked in a vertical direction with respect to the semiconductor substrate, thus creating a three-dimensional array structure as opposed to a planar two-dimensional array structure. As described in greater detail below, the lack of separation between the charge trapping regions of the memory cells in three-dimensional array structures provide further challenges with respect to the reliability and retention of the programmed data.

Accordingly, as the industry continues to achieve smaller sized memory cells with increased storage densities in order to store more data, this scaling of size entails certain performance and durability risks. In order to achieve the advantage of higher memory capacity for a fixed die size, smaller memory cells must be packed more closely together. Doing so, however, may result in an increased number of manufacturing, memory operation, and performance errors. For example, potentially catastrophic structural defects that occur between neighboring components, such as electrical shorting between adjacent word lines, occur more readily in compacted spaces. In addition, according to observations, in a scalable memory structure, there is a distinct challenge in maintaining the stability and the uniformity across an entire memory structure with respect to the semiconductor materials used to fabricate certain memory storage elements of the scalable memory, wherein such nonuniformities can lead to performance limitations and inconsistencies in, for example, operation of the memory's sense structure. As an example, there appears to be a distinct correlation, or dependence, between variations amongst the relative thicknesses of the multiple gate oxide (e.g., $SiO_2$) layers that comprise a substructure (e.g., a memory cell, string or block) of a scalable memory (as a consequence of existing fabrication processes) and an inconsistency or unpredictability in, for example, the biasing voltage(s) that are necessary to program or erase a memory cell of the substructure with respect to the cell's target threshold voltage ($V_{th}$) range. Unfortunately, the presence or magnitude of variations in thicknesses amongst the multiple gate oxide layers is significantly more pronounced in the higher-density, bit-scalable (BiCS) memory devices, likely due to the compact and stacked nature of their storage elements, as well as their associated circuitry.

To compensate for these types of disturbances or inaccuracies, various algorithmic methods exist for identifying, filtering and/or correcting noise and bit errors during the read operation and subsequent processing. However, these overarching and generalized mitigation measures add complexity and latencies to the memory operations. Accordingly, there is a particular need for an improved mitigation or compensation mechanism that can operate at the point of a read or verify operation and in a predictive manner that harnesses, or takes into consideration, an observed relationship between a structural discordance or irregularity in the memory device and an operational effect, where such a factor exists, all while maintaining the scale and efficiency of high-density memory structures. Of particular focus herein is the discovered connection between the variable thicknesses of the gate oxide layers of a memory substructure and a corresponding fluctuation in the electrical resistivity that, in turn, causes problematic inaccuracies or disturbances in certain memory operations, leading to performance dissonances.

SUMMARY

Various embodiments include a method for programming a target memory cell in a memory array of a non-volatile memory system, the method comprising defining a default read biasing voltage value and a default verify biasing voltage value for each program state of a target memory cell of a memory structure, determining a location of a target memory cell within the memory structure and, based upon the determined location of the target memory cell, applying a first incremental offset voltage to the default read biasing voltage value with respect to each program state, and applying a second incremental offset voltage to the default verify biasing voltage value with respect to each program state.

Other embodiments include a memory controller comprising a first port configured to couple to a non-volatile memory structure, wherein the memory structure comprises at least one vertical three-dimensional NAND-type memory string having a target memory cell amongst a plurality of memory cells exhibiting variations in their respective gate oxide thicknesses, and wherein the memory controller is configured to define a default read biasing voltage value and a default verify biasing voltage value for each program state of the target memory cell, determine a location of the target memory cell within the memory string and, based upon the determined location of the target memory cell, apply a first incremental offset voltage to the default read biasing voltage value with respect to each program state, and apply a second incremental offset voltage to the default verify biasing voltage value with respect to each program state.

Additional embodiments include a non-volatile memory system that is comprised of a memory structure that comprises at least one vertical three-dimensional NAND-type memory string having a target memory cell amongst a plurality of memory cells exhibiting variations in their respective gate oxide thicknesses, and a memory controller coupled to the memory structure and defining a default read biasing voltage value and a default verify biasing voltage value for each program state of the target memory cell, determining a location of the target memory cell within the memory string and, based upon the determined location of the target memory cell, applying a first incremental offset voltage to the default read biasing voltage value with respect to each program state, and applying a second incremental offset voltage to the default verify biasing voltage value with respect to each program state.

BRIEF DESCRIPTION OF THE DRAWINGS

A more detailed description is set forth below with reference to example embodiments depicted in the appended figures. Understanding that these figures depict only example embodiments of the disclosure and are, therefore, not to be considered limiting of its scope, the disclosure is described and explained with added specificity and detail through the use of the accompanying drawings in which:

FIG. 15 is a chart providing a comparison of observational data with respect to the number of required verification loops for each of programmable states A through G of an exemplary three-dimensional memory array structure exhibiting variable gate oxide thicknesses amongst its memory storage elements, in accordance with exemplary embodiments;

FIG. 16-A is a flow diagram generally illustrating the steps of program verify and read operations of a target memory cell with adjusted verify and read voltage biasing levels that are dependent upon a location of the target memory cell within an exemplary three-dimensional memory structure, according to another exemplary embodiment; and FIG. 16-B is a flow diagram generally illustrating the steps of program verify and read operations of a target memory cell with adjusted verify and read voltage biasing levels that are dependent upon a location of the target memory cell within an exemplary three-dimensional memory structure, according to a further exemplary embodiment.

DETAILED DESCRIPTION

Figure 1:
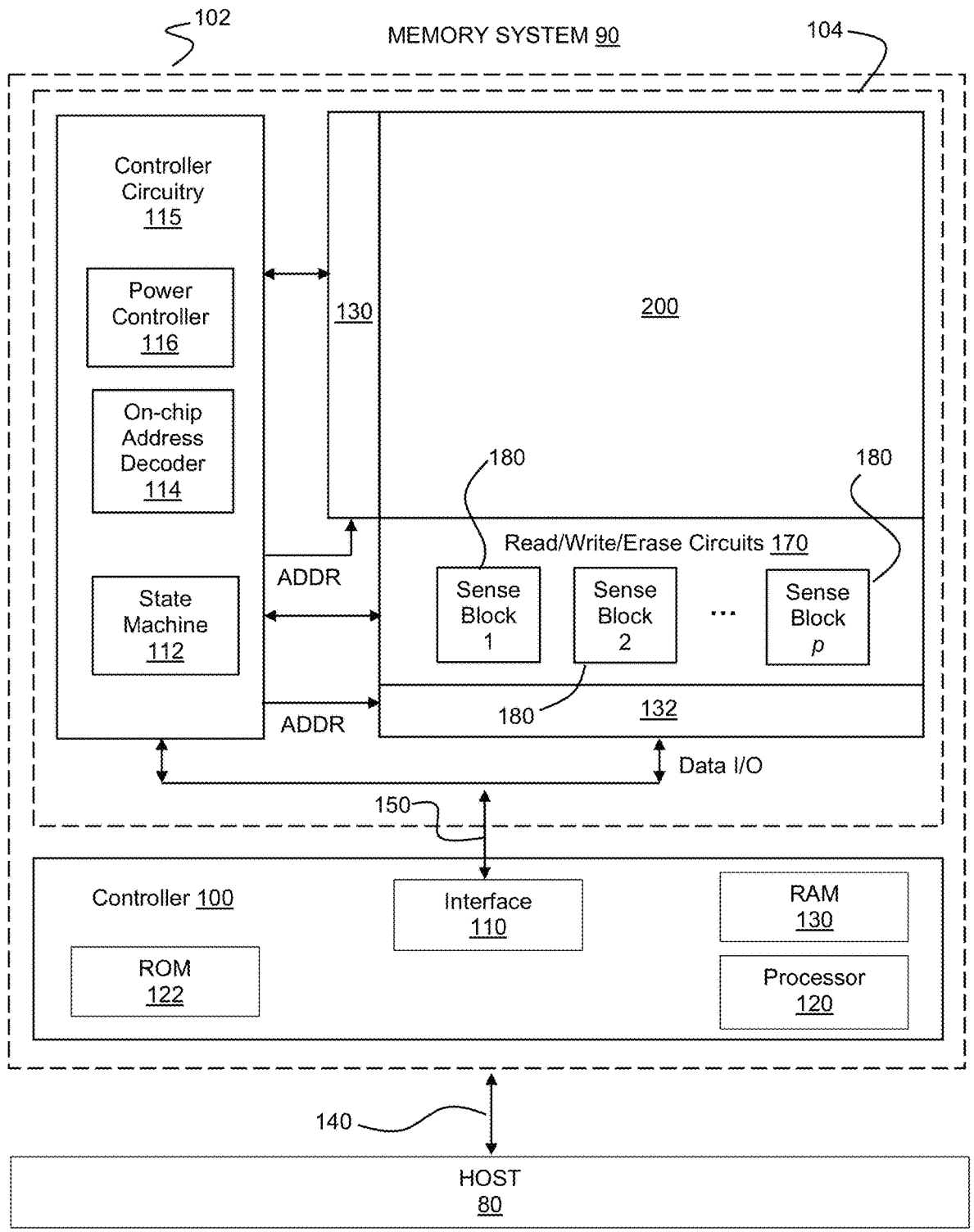
FIG. 1 is a block diagram of a memory system, in accordance with exemplary embodiments.

The following description is directed to various exemplary embodiments of the disclosure. Although one or more of these embodiments may be preferred, the embodiments disclosed should not be interpreted, or otherwise used, as limiting the scope of the disclosure, including the claims. In addition, one skilled in the art will understand that the following description has broad application, and the detailed explanation of any specific embodiment is meant only to be exemplary of that embodiment and is not intended to suggest that the scope of the disclosure, including the claims, is limited to that particular embodiment.

The several aspects of the present disclosure may be embodied in the form of an apparatus, system, method, or computer program process. Therefore, aspects of the present disclosure may be entirely in the form of a hardware embodiment or a software embodiment (including but not limited to firmware, resident software, micro-code, or the like), or may be a combination of both hardware and software components that may generally be referred to collectively as a "circuit," "module," "apparatus," or "system." Further, various aspects of the present disclosure may be in the form of a computer program process that is embodied, for example, in one or more non-transitory computer-readable storage media storing computer-readable and/or executable program code.

Additionally, various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that comprises customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electromagnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it comprises one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Further, the terms "program," "software," "software application," and the like as may be used herein, refer to a sequence of instructions that is designed for execution on a computer-implemented system. Accordingly, a "program," "software," "application," "computer program," or "software application" may include a subroutine, a function, a procedure, an object method, an object implementation, an executable application, an applet, a servlet, a source code, an object code, a shared library/dynamic load library and/or other sequence of specific instructions that is designed for execution on a computer system.

Additionally, the terms "couple," "coupled," or "couples," where may be used herein, are intended to mean either a direct or an indirect connection. Thus, if a first device couples, or is coupled to, a second device, that connection may be by way of a direct connection or through an indirect connection via other devices (or components) and connections.

Regarding, the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that comprises the element.

The terms "a," "an," and "the" also refer to "one or more" unless expressly specified otherwise. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or mores," "ones or more," and/or "ones or mores" according to set theory, unless expressly specified otherwise.

In the detailed description that follows, reference is made to the appended drawings, which form a part thereof. It is recognized that the foregoing summary is illustrative only and is not intended to be limiting in any manner. In addition to the illustrative aspects, example embodiments, and features described above, additional aspects, exemplary embodiments, and features will become apparent by reference to the drawings and the detailed description below. The description of elements in each figure may refer to elements of proceeding figures. Like reference numerals may refer to like elements in the figures, including alternate exemplary embodiments of like elements.

Referring now to the drawings in detail and beginning with FIG. 1, there is depicted an exemplary embodiment of a memory system 90 and is an illustration of its main hardware components. In this particular embodiment, the memory system 90 operates and is in communication with a host device 80 through a host interface. Further, the memory system 90 comprises a memory device 102 whose operations are controlled by a controller 100. The host device 80 may comprise any device or system that utilizes the memory system 90 (e.g., a computing device). Accordingly, the memory system 90 may be in the form of a removable memory card or an embedded memory system. For example, the memory system 90 may be embedded in a solid-state drive that is installed in a laptop computer. In another example, the memory system 90 may be embedded within the host device 80 such that the host 80 and the memory system 90 (including controller 100) are formed on a single integrated circuit chip. In embodiments in which the memory system 90 is implemented within a memory card, the host device 80 may include a built-in receptacle for the one or more types of memory cards or flash drives (e.g., a universal serial bus (USB) port, or a memory card slot). Further, the host 80 may use adapters in which a memory card is plugged.

Still referring to FIG. 1, as described in detail below, the memory device 102 may comprise one or more memory arrays 200 of a plurality of non-volatile memory cells that are distributed over one or more integrated circuit chips. And, in accordance with this particular embodiment, the controller 100 may include several components that may include, but are not limited to, interface circuits 110, a processor 120, ROM (read-only memory) 122, RAM (random access memory) 130, and additional components. The controller 100 may, for example, be in the form of one or more application-specific integrated circuits (ASIC) in which the components included in such an ASIC depend on the particular application.

Figure 2:
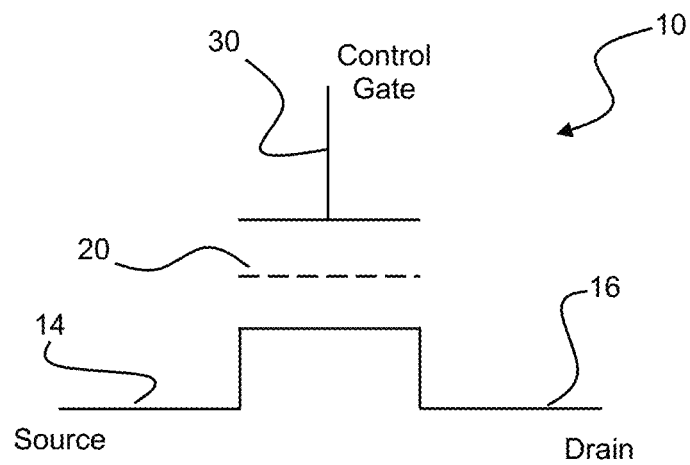
FIG. 2 schematically depicts a non-volatile memory cell, in accordance with exemplary embodiments.

With respect to the memory array 200 itself, FIG. 2 is a schematic depiction of an individual non-volatile memory cell 10 in accordance with an exemplary embodiment. As is mentioned above, the memory cell 10 may be implemented by a field-effect transistor having a charge storage unit 20, such as a floating gate or a dielectric layer. In addition, the memory cell 10 comprises a source region 14 and a drain region 16. Further, a control gate 30 is positioned above the floating gate 20. Example types of non-volatile memory cells having this general structure include, but are not limited to, electrically erasable programmable read-only memory (EEPROM) and flash EEPROM, NAND (NOT-AND)-type cells, and memory devices utilizing dielectric storage elements (e.g., NROM™). In operation, the memory state of a cell (e.g., programmed or erased) may, in accordance with certain embodiments, be read by sensing the conduction current across the source and drain electrodes of the memory cell when a reference voltage is applied to the control gate 30. More specifically, for each given charge on the floating gate 20 of a memory cell, a corresponding conduction current with respect to a fixed reference control gate voltage may be detected. Accordingly, as is described above, the range of charges programmable onto the floating gate defines a corresponding threshold voltage window or a corresponding conduction current window of the memory cell 10. Alternatively, rather than detecting the conduction current among a partitioned current window, it is possible to set the threshold voltage for a given memory state under test at the control gate 30 and detect if the resulting conduction current is higher than or lower than a threshold current (i.e., a cell-read reference current). In one such exemplary implementation, detection of the conduction current relative to a threshold current is accomplished by examining a discharge rate of the conduction current through the capacitance of a respective bit line (BL).

Figure 3:
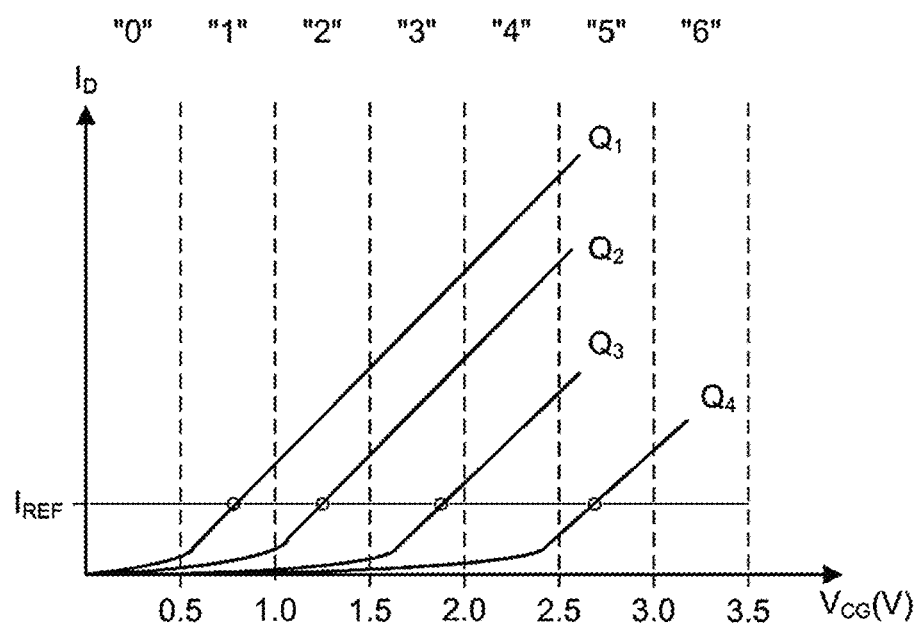
FIG. 3 depicts the relationship between a source-drain current ID and a control gate voltage $V_{CG}$ for four different charges Q1-Q4 that a floating gate of a non-volatile memory cell may be selectively storing at any one time at a fixed drain voltage, in accordance with exemplary embodiments.

FIG. 3 provides a graphical illustration of the correlation between the source-drain current ID and control gate voltage $V_{CG}$ for, for example, a non-volatile memory cell 10 having four different charge states Q1-Q4 that the floating gate may be selectively storing at any given time. As shown, with a fixed drain voltage bias, there exists four solid ID versus $V_{CG}$ curves representing four charge levels (or states) that can be programmed onto a floating gate of the memory cell, wherein the four charge levels respectively correspond to four of eight possible memory states. Therefore, as an example, the threshold voltage ($V_{th}$) window of a population of memory cells may range from 0.5 V to 3.5 V. In such an example, seven programmed memory states assigned as "0," "1," "2," "3," "4," "5," and "6," respectively, and one erased state (not shown in FIG. 3), may be demarcated by partitioning the threshold voltage ($V_{th}$) window into regions at intervals of 0.5 V each. Accordingly, if a reference current $I_{REF}$, of 2 µA is used as depicted, then a memory cell that is programmed with Q1 voltage may be considered to be in a memory state "1" as its curve intersects with $I_{REF}$ in the region of the threshold voltage ($V_{th}$) window that is demarcated by the voltage range VCG=0.5 V and 1.0 V. Similarly, Q4 is in a memory state "5."

Thus, as mentioned above, the more states that a memory cell 10 is made to store, the more finely divided is its threshold voltage ($V_{th}$) window. For example, in a memory cell 10 having a threshold voltage ($V_{th}$) window ranging from −1.5 V to 5 V, and thereby providing a possible maximum width (or distribution) of 6.5 V and storage across 16 memory states, each memory state may only occupy a voltage range of, for example, 200 mV to 300 mV. However, such a narrow voltage range will require higher precision in both the programming and read memory operations to achieve the required resolution.

Figure 4A:
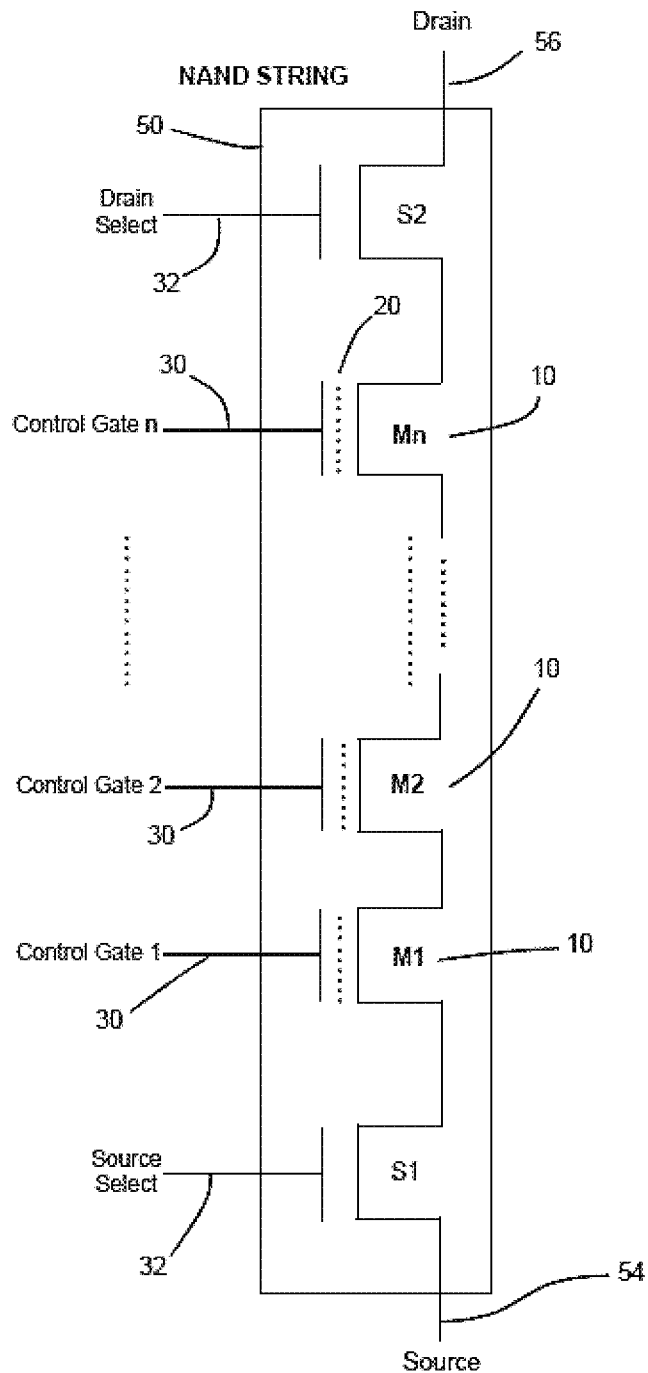
FIG. 4A schematically depicts a series of NAND-type memory cells organized into a string, in accordance with exemplary embodiments.

According to certain exemplary embodiments, the individual memory cells 10 are organized into one or more strings, wherein each string is comprised of memory cells placed in series. For example, depicted in FIG. 4A is an exemplary embodiment of a string 50 that is comprised of NAND-type memory cells placed in a series configuration, wherein the transistor elements, i.e., $M_1$, $M_2$, ..., $M_n$ (in which "n" may equal 4, 8, 16, or higher), are daisy-chained at their source and drain regions. Further, as discussed above with respect to FIG. 2, each of the memory transistors 10 in a string 50 has a charge storage element 20 (e.g., a floating gate) for storing a certain amount of charge therein so as to represent an intended memory state of that memory cell, wherein each memory transistor 10 comprises a control gate 30 that allows for control over the read and write memory operations. Present at the source terminal 54 and drain terminal 56 of the string 50 are select transistors S1, S2 that control the memory transistor's connection to the outlaying memory array. Specifically, when the source select transistor S1 is turned on, source terminal 54 of string 50 is coupled to a source line (SL). Likewise, when the drain select transistor S2 is turned on, the drain terminal 56 of string 50 is coupled to a bit line (BL) of the memory array.

Figure 4B:
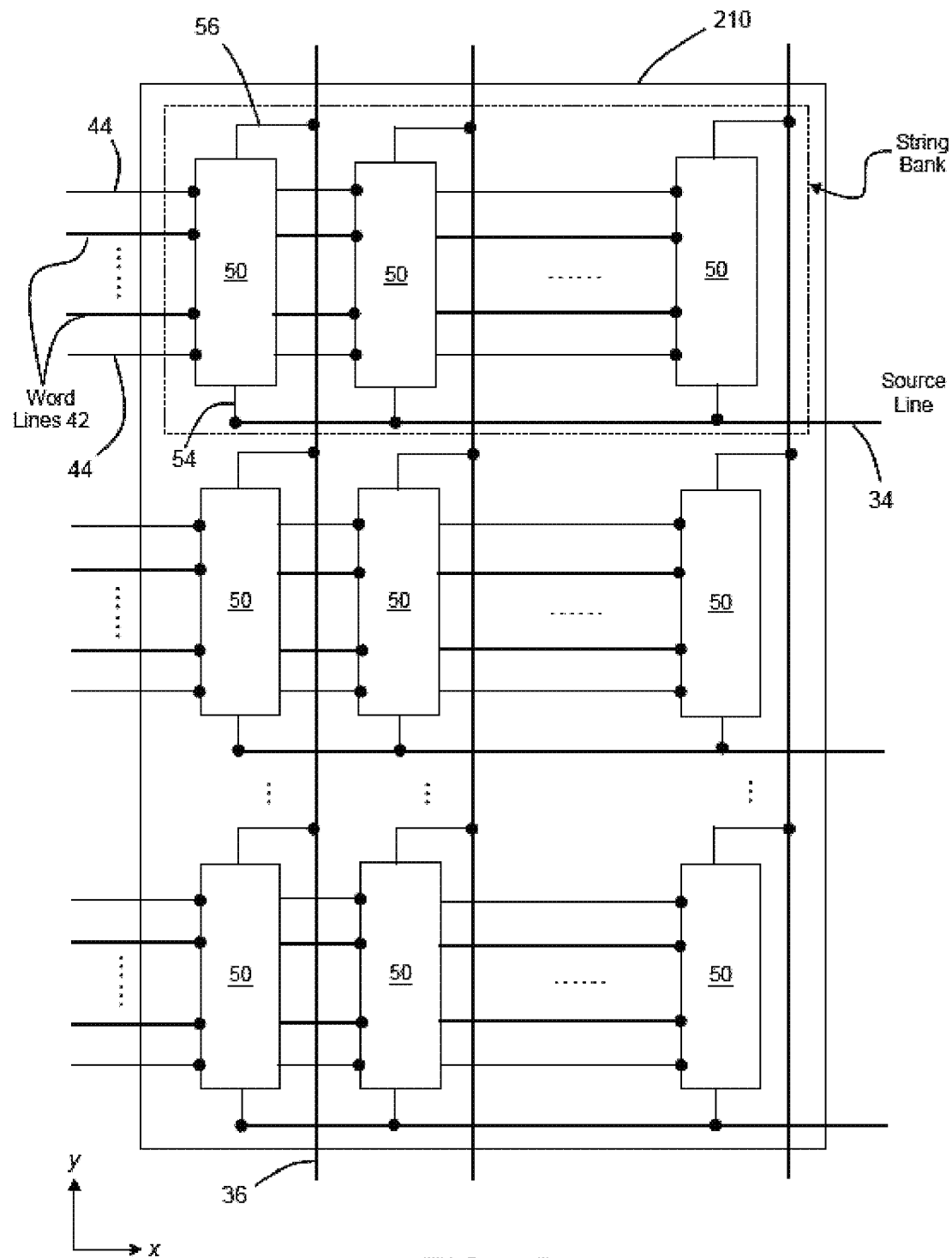
FIG. 4B schematically depicts a two-dimensional memory cell array, comprising a plurality of NAND-type strings, such as the type depicted in FIG. 4A, in accordance with exemplary embodiments.

Expanding outward a hierarchical level, FIG. 4B is a schematic diagram depicting an exemplary embodiment of a memory array 200 (such as memory array 210) comprised of a plurality of NAND strings 50 of the type illustrated in FIG. 4A. Along each column of NAND strings 50, a bit line (BL) 36 is coupled to the drain terminal 56 of each NAND string 50. In addition, along each bank of NAND strings 50, a source line (SL) 34 is coupled to the source terminals 54 of each NAND string 50. Further, the control gates 30 of the memory transistors 10 in a row of memory cells in the bank of NAND strings 50 are connected to the same word line (WL) 42. Therefore, when an addressed memory transistor 10 within a NAND string 50 is read or verified during a programming operation, an appropriate voltage is applied to its control gate 30. Concurrently, the remaining non-addressed memory transistors 10 within the NAND string 50 are fully turned on by applying a sufficient voltage to their respective control gates 30. As a result, an electrically conductive pathway is created from the source of the addressed memory transistor 10 to the source terminal 54 of NAND string 50, and from the drain of the addressed memory transistor 10 to the drain terminal 56 of the cell.

Further, the control gates 32 of the select transistors S1, S2 of each NAND string 50 in the memory array 210 provide control access to the NAND string at its source terminal 54 and drain terminal 56. The control gates 32 of the select transistors S1, S2 along a row in a bank of NAND strings 50 are connected to the same select line 44. Thus, an entire row of memory cells 10 in a bank of NAND strings 50 can be addressed by applying the appropriate voltages on the word lines (WL) 42 and select lines 44 of the bank of NAND strings 50.

Figure 5:
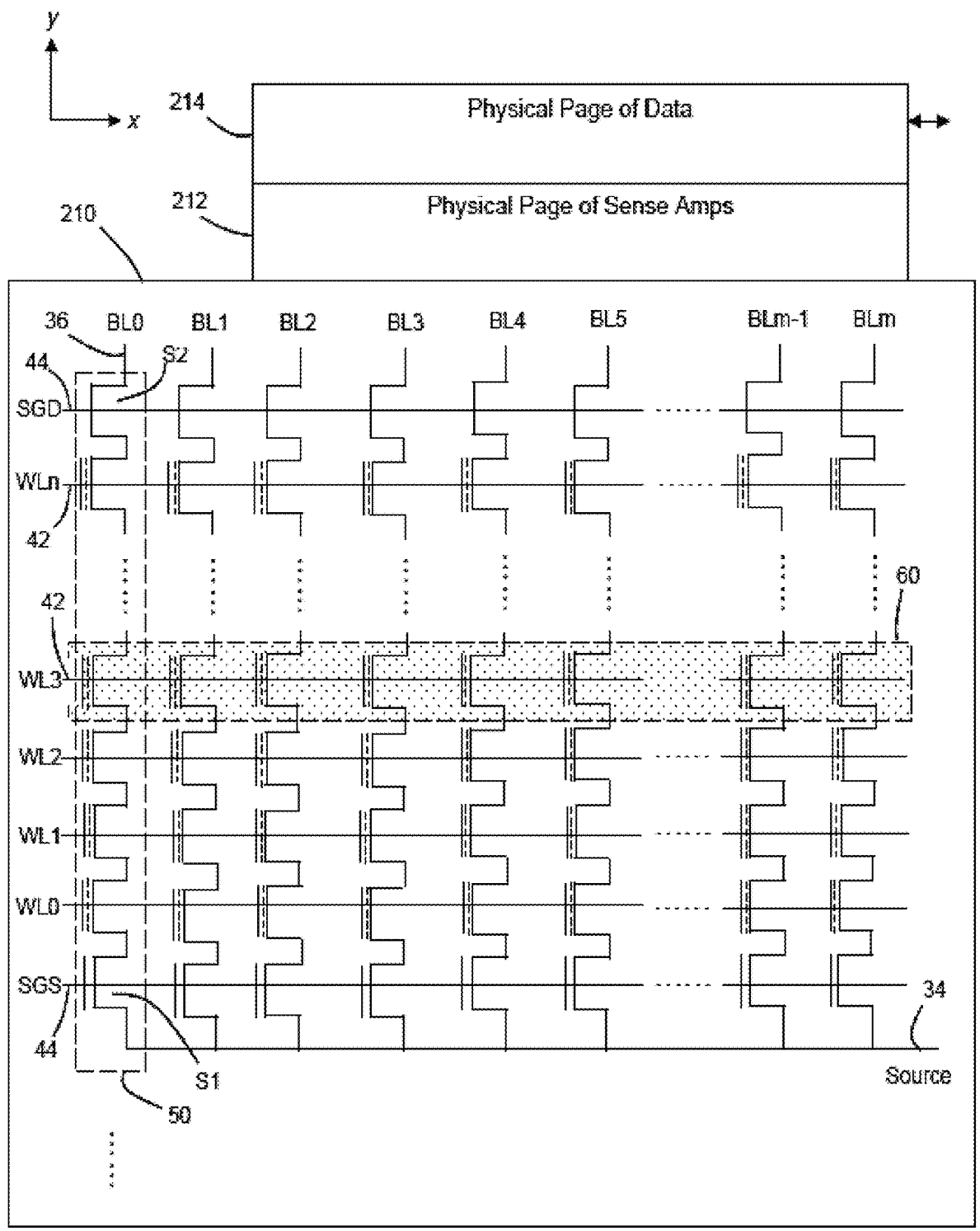
FIG. 5 depicts a page of memory cells being sensed or programmed in parallel, and in relation to a memory array organized in a NAND-type configuration, in accordance with exemplary embodiments.

Referring now to FIG. 5, depicted there is a detailed illustration of a bank of NAND strings 50 of a memory array 210 according to an exemplary embodiment thereof. This view is particularly useful in visualizing a row-by-row configuration of the memory array 210, wherein each row may be referred to as a physical "page." Accordingly, a physical page (e.g., page 60 denoted in FIG. 5) is a group of memory cells 10 that is enabled to be sensed or programmed in parallel. In such a configuration, a page is the smallest unit of the memory device that may be programmed or written to. Programming of a page is accomplished by a corresponding page of sense amplifiers (SA) 212, wherein each sense amplifier may be coupled to a respective NAND string 50 via a bit line (BL) (see e.g., the bit lines BL0, BL1, BL2, . . . , BLm−1, and BLm, as depicted in FIG. 5). Thus, a page 60 is enabled by the control gates of the plurality of memory cells 10 in page 60, which are connected to a common word line (WL) 42, and each memory cell 10 of the page 60 is accessible by a sense amplifier via a bit line 36. Accordingly, when programming or sensing a page 60 of memory cells 10, a programming or sensing voltage is respectively applied to the common word line (e.g., word line WL3 with respect to page 60) together with the appropriate voltages on the bit lines.

Regarding the manner in which data is programmed and erased, it is important to note that, with respect to flash memory, a memory cell must be programmed from an erased state. In other words, a floating gate 20 must first be emptied of charge, thereby placing the memory cell in an erased state, before a programming operation can subsequently add a desired amount of charge back to the floating gate 20. Thus, the level of charge on a floating gate 20 cannot be incrementally increased or decreased from its previous programmed level. Therefore, it is not possible for update data to overwrite the existing data of a memory cell 10. Rather, the update data must be programmed to a previous unwritten location.

For purposes of promoting performance in erase operations, an array 210 of memory cells 10 is, for example, divided into a large number of blocks of memory cells, wherein a block is the smallest unit of the memory device in which the memory cells contained may be erased together. Furthermore, each block of memory cells 10 may be divided into a number of physical pages 60 wherein, as mentioned above, a programming operation is conducted page by page. Accordingly, a logical page is a unit of programming or reading that contains a number of bits equal to the number of memory cells 10 in a given physical page.

Figure 6:
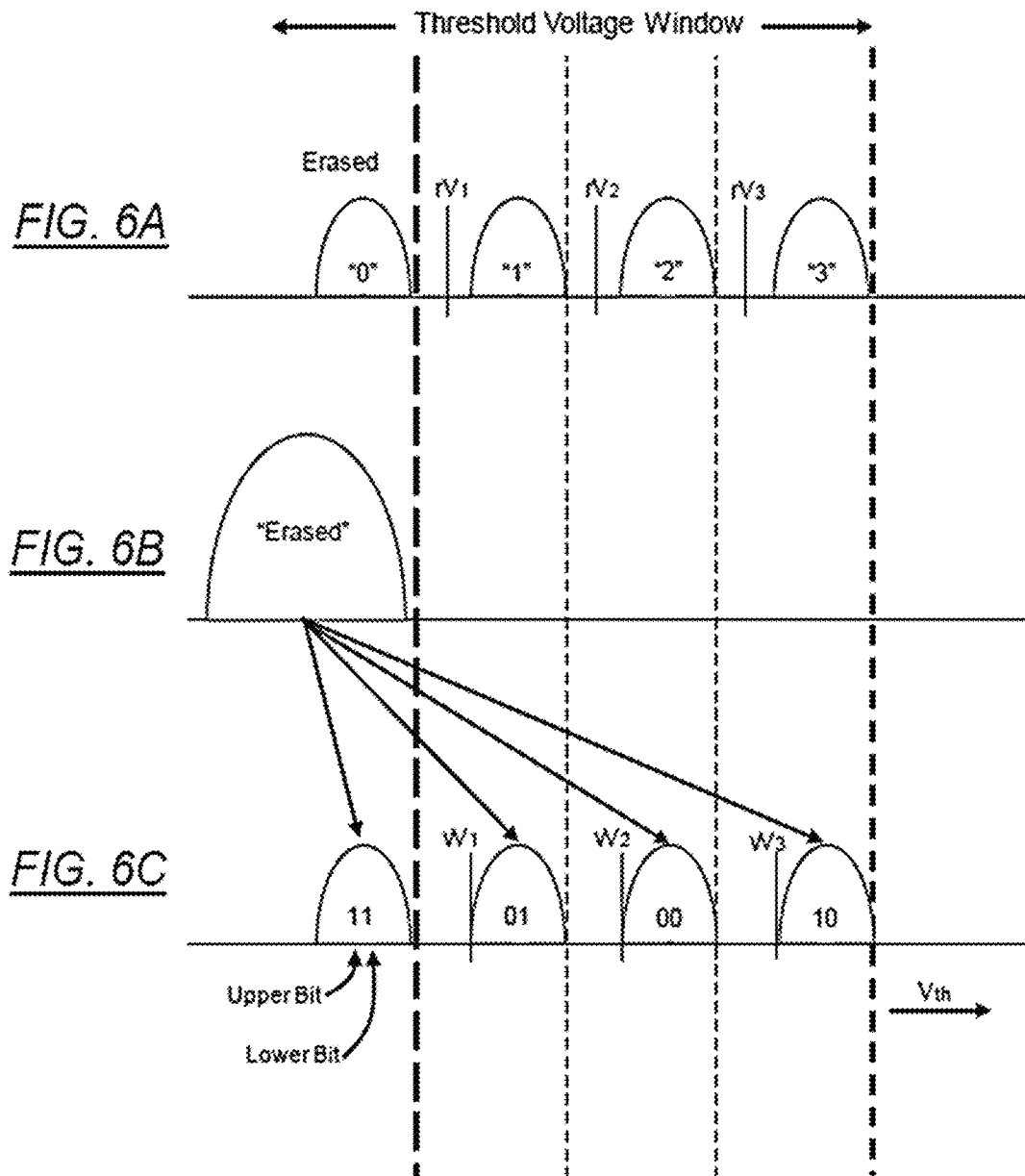
FIGS. 6A-C depict stages of programming four states of a population of MLC-type memory cells, in accordance with exemplary embodiments.

To illustrate an exemplary embodiment of the programming stages of, for example, a MLC memory device that is comprised of a population of four-state memory cells, reference is made to FIGS. 6A-C.

To illustrate an exemplary embodiment of the programming stages of, for example, a MLC memory device that is comprised of a population of four-state memory cells, reference is made to FIGS. 6A-C. In FIG. 6A, there is depicted a population of memory cells in which the characteristic threshold voltage ($V_{th}$) window is divided into four distinct voltage distributions, with each distribution corresponding to a programmable memory state (i.e., memory states "0," "1," "2," and "3"). FIG. 6B illustrates an initial distribution of "erased" threshold voltages ($V_{th}$) for an erased memory. In FIG. 6C, much of the memory cell population has been programmed such that the initial "erased" threshold voltage of a given memory cell 10 is moved to a higher value into one of the three divided voltage zones that are demarcated by verify levels $vV_1$, $vV_2$, and $vV_3$. Accordingly, each memory cell can be programmed to one of the three programmable states "1," "2," and "3," or remain in the "erased" state. On a bit level, a two-bit code having, for example, a lower bit and upper bit can be used to represent each of the four memory states. For example, as depicted in FIG. 6C, the memory states "0," "1," "2," and "3" may be assigned bit values "11," "01," "00," and "10" respectively. In such example, the two-bit data may be read from the memory by sensing in a "full-sequence" mode in which the two bits are, for example, sensed together by sensing relative to the corresponding read demarcation threshold voltages—rV1, rV2, and rV3—in three sub-passes respectively.

Figure 7:
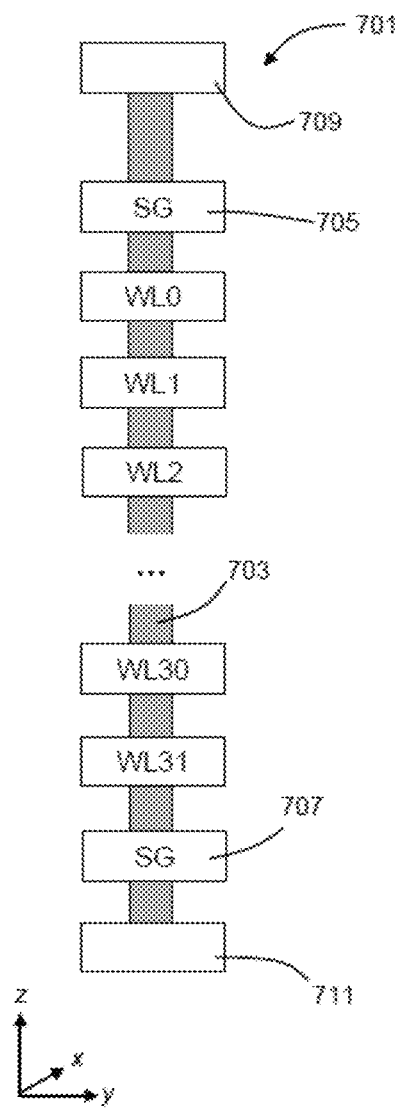
FIG. 7 depicts a vertical NAND-type string of a three-dimensional memory array, in accordance with exemplary embodiments.

In FIGS. 4A-B and 5 and the foregoing corresponding description, there is generally described a two-dimensional (or planar) memory array 210 (lying in a x-y plane, for example), which may comprise NAND-type memory cells. However, in an alternative configuration, a memory array may be in the form of a three-dimensional array that, unlike being formed on a planar surface of a semiconductor wafer, the array extends upwards from the wafer surface and comprises stacks or columns of memory cells extending vertically in an upwards direction (for example, in a z direction that is perpendicular to the x-y plane). As a result, three-dimensional memory structures increase the storage density but consume less chip surface. For example, in FIG. 7 there is depicted an exemplary embodiment of a 3D NAND-type string 701, which is operated in a similar manner as a two-dimensional NAND-type string, such as the NAND-type string 50 described above. In this configuration, a memory cell is formed at the juncture of a vertical bit line (BL) (see e.g., the local bit line 703) and a word line (see e.g., word lines WL0, WL1, etc.), wherein a charge trapping layer located between the local bit line 703 and an intersecting word line (WL) stores charge. In order to form such a vertical string 701, stacks of word lines are formed and memory holes are etched at the appropriate locations where the cells are to be formed, wherein each memory hole is lined with a charge trapping layer and filled with a suitable local bit line/channel material. Additionally, dielectric layers are included for the necessary isolation. Further, located at either end of the NAND-type string 701 are select gates 705, 707, which allow for the selective connection to, or isolation from, external elements 709, 711 that include, for example, conductive lines (such as common source lines or bit lines) that serve large numbers of strings 701 of a memory array. In the particular embodiment shown in FIG. 7, the vertical NAND-type string 701 has 32 memory cells (i.e., at the juncture between the local bit line 703 and word lines 0 through 31) that are connected in series. However, a NAND-type string 701 may comprise any suitable number of memory cells.

Referring back to the overall architecture of a memory system that is, for example, depicted in FIG. 1, there is shown a schematic depiction of a typical arrangement of an example memory device 102. In this particular embodiment, the memory device 102 comprises one or more memory die 104 wherein each memory die 104 may include a two- or three-dimensional memory structure 200, such as the two- and three-dimensional memory arrays described above with respect to FIGS. 4A-B, 5 and 6, as well as the associated control circuitry 115 and read/write/erase circuits 170. For example, memory structure 200 may comprise a monolithic three-dimensional memory structure in which multiple memory levels are formed above (rather than in) a single substrate, such as a wafer, without any intervening substrates. Further, the memory structure 200 may be comprised of any type of non-volatile memory monolithically formed in one or more physical levels of arrays of memory cells having an active area that is disposed above a silicon substrate. Such a memory structure may be in a non-volatile memory device in which the circuitry that is associated with the operation of the memory cells may be above or within the substrate.

Still referring to FIG. 1, the memory structure 200 is accessible by the read/write/erase circuits 170 by way of a row decoder 130 and a column decoder 132. As previously described, individual memory cells of the memory structure 200 are addressable via a set of selected word lines (WL) and bit lines (BL). Specifically, the row decoder 130 selects the one or more word lines and the column decoder 132 selects one or more bit lines in order to apply the appropriate voltages to the respective gates of the addressed memory cells. As shown in FIG. 1, the read/write/erase circuits 170 comprise multiple sense blocks 180 (Sense Block 1, Sense Block 2, . . . , Sense Block p) that are connectable via bit lines to the memory elements of the memory structure 200. The sense blocks 180 allow memory cells connected to a common word line (referred to as a "page" of memory cells) to be read or programmed in parallel. In some embodiments, a controller 100 is included in the same memory device 102 as the one or more memory die 104 or, in other embodiments, the controller 100 may be located separate from the memory die 104. In some embodiments, the controller 100 may be on an entirely different die from the memory die 104. Further, in certain embodiments, each memory die 104 may have its own controller 100 or, in other embodiments, one controller 100 may communicate amongst multiple memory die 104. According to the exemplary embodiment of FIG. 1, commands and data are transferred between the host 80 and the controller 100 by way of a data bus 140, and between the controller 100 and the one or more memory die 104 via lines 150. According to certain embodiments, the memory die 104 include input and/or output (I/O) pins that connect to the lines 150.

According to certain exemplary embodiments, the controller 100 manages data that is stored in the memory device 102 and communicated with the host 80. The controller 100 may have various functionalities that include, for example, formatting the memory to ensure it is operating properly, map out bad memory components, and allocate spare memory cells to be substituted for future failed cells. In operation, when a host 80 needs to read data from or write data to the memory, it will communicate with the controller 100. If the host provides a logical address to which data is to be read/written, the controller 100 can convert the logical address received from the host to a physical address in the memory. Alternatively, the host can provide the physical address. In further embodiments, the controller 100 can perform various memory management functions such as, but not limited to, wear leveling (distributing writes in order to avoid repeatedly writing, and thereby wearing out, specific blocks of memory) and garbage collection in which, for example, valid pages of data are culled (or moved) from a full memory block in order for the entire block to be erased and reused.

The components of the controller 100 may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example. In some exemplary embodiments, each module may comprise an application-specific integrated circuit (ASIC), a Field Programmable Gate Array (FPGA), a circuit, a digital logic circuit, an analog circuit, a combination of discrete circuits, gates, or any other type of hardware or combination thereof. Alternatively, or in addition, each module may include software stored in a processor readable device (e.g., memory) to program a processor for controller 100 to perform the desired functions.

Additionally, the control circuitry 115 cooperates with the read/write/erase circuits 170 in performing memory operations (e.g., read, program, erase, etc.) with respect to memory structure 200, and includes, for example, a state machine 112, an on-chip address decoder 114, and a power control module 116. The state machine 112 provides die-level control of memory operations that include, for example, programming certain memory cells to different final target states. Further, the on-chip address decoder 114 provides an address interface between the addresses used by host 80 or controller 100 to the hardware address used by row and column decoders 130, 132. The power control module 116 controls the power and voltages that are supplied to the word lines and bit lines during memory operations. As such, the power control module 116 may comprise drivers for word line layers (with respect to a 3D memory configuration), select transistors, and source lines. Also, the power control module 116 may include charge pumps for generating voltages. The sense blocks 180 include the bit line drivers. Any one or any combination of control circuitry 115, state machine 112, decoders 114/130/132, power control module 116, sense blocks 180, read/write/erase circuits 170, and/or controller 100 can be considered a control circuit that performs the functions described herein.

As described above, memory cells of the memory structure 200 may be arranged in a single memory device level in an ordered two-dimensional array of a plurality of rows and/or columns. Alternatively, a three-dimensional memory array may be arranged such that memory cells occupy multiple planes or multiple memory device levels, thereby forming a structure that has three dimensions (e.g., in the x, y, and z directions, wherein the z direction is substantially perpendicular and the x and y directions are substantially parallel to the major surface of the semiconductor substrate). In some exemplary embodiments, a three-dimensional memory structure 200 may be vertically arranged as a stack of multiple two-dimensional memory array device levels. In other exemplary embodiments, the three-dimensional memory structure 200 is arranged as multiple vertical columns (wherein each column extends substantially perpendicular to the major surface of the substrate, i.e., in the z direction) with each column having multiple memory cells. In this example, the vertical columns may be arranged in a two-dimensional configuration (i.e., in the x-y plane), thereby forming a three-dimensional arrangement in which the memory cells are on multiple vertically stacked memory planes. Other configurations of memory elements in three dimensions can also constitute a three-dimensional memory array. However, generally speaking, a three-dimensional NAND array may be constructed by tilting a two-dimensional memory structure, such as structures 50 and 210 of FIGS. 4A-B and 5, respectively, in the vertical direction that is perpendicular to the x-y plane (i.e., the z direction), such that each y-z plane of the three-dimensional structure corresponds to the page structure of FIG. 5, wherein each plane is at differing locations along the x axis. As a result, the global bit lines (e.g., BL0, . . . , BLm, of FIG. 5) each run across the top of the memory structure to an associated sense amplifier (e.g., SA0, . . . , SAm). Accordingly, the word lines (e.g., WL0, . . . , WLn, of FIG. 5), and the source and select lines (e.g., SSL0, . . . , SSLn, and DSL0, . . . , DSLn, respectively) extend in the x direction, with the bottom of each NAND string (e.g., string 50) connected to a common source line.

Figure 8:
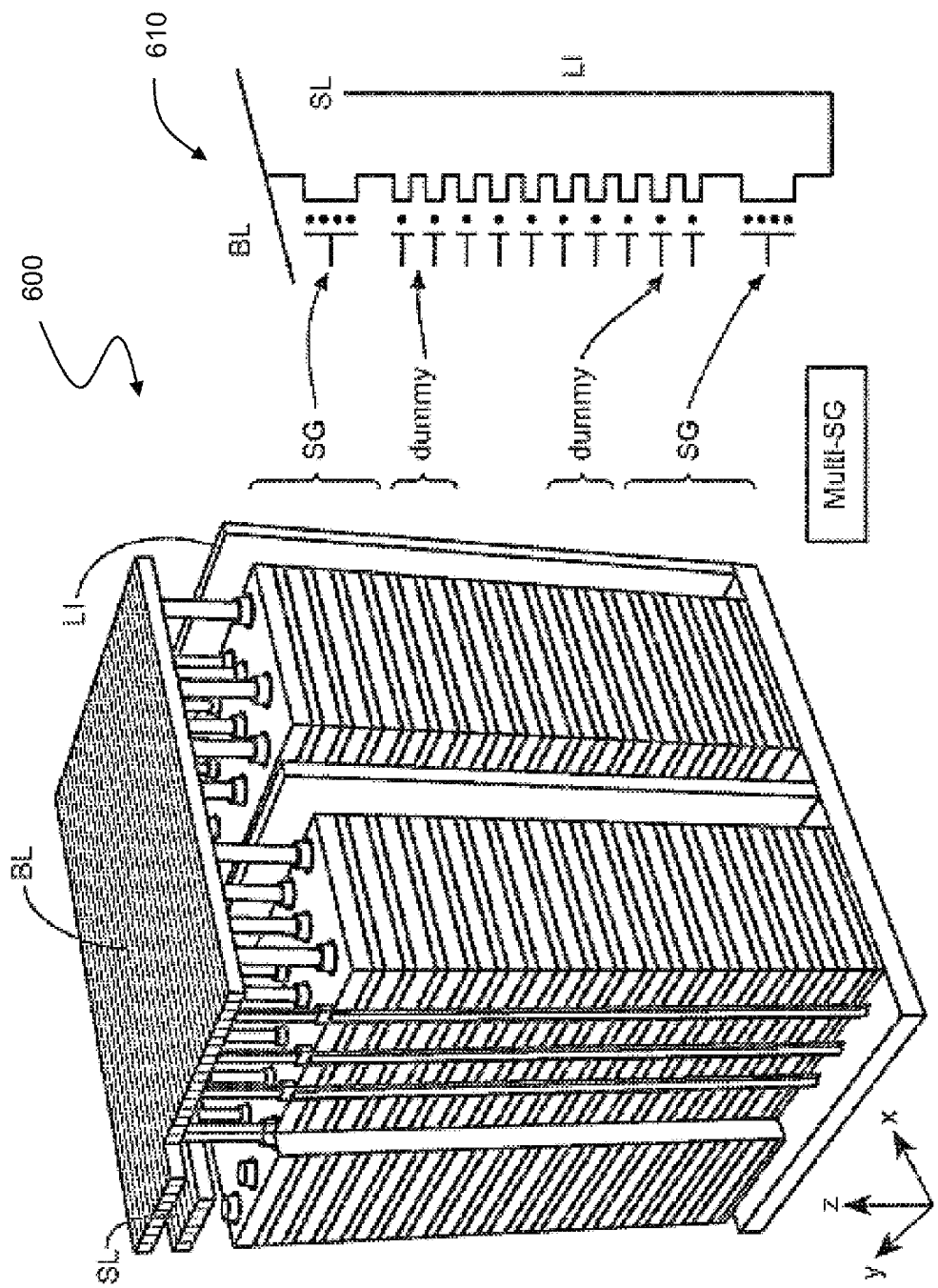
FIG. 8 is a perspective view of a representative subsection of a monolithic three-dimensional NAND-type memory array, in accordance with exemplary embodiments.

Referring now to FIG. 8, there is depicted an oblique perspective view of an example subsection of an embodiment of a three-dimensional NAND memory array 600 of the Bit Cost Scalable ("BiCS") type in which one or more memory device levels is formed above a single substrate. The example subsection corresponds to two of the page structures shown in FIG. 4B wherein, depending upon the particular embodiment, each may correspond to a separate memory block or may be different extensions of the same block. According to this embodiment, rather than lying in the same y-z plane, the NAND strings are pressed in the y-direction such that the NAND strings have a staggered configuration in the x-direction. Further, at the top of the array 600, the NAND strings are connected along global bit lines (BL) that span multiple of these subsections of the array 600 that run in the x-direction. In addition, global common source lines (SL) also run across multiple subsections of the memory array 600 in the x-direction and are connected to the sources at the bottom of the NAND strings by a local interconnect (LI) that operates as the local common source line of the individual extension. However, dependent upon the embodiment, the global source lines (SL) can span the whole, or just a subsection, of the memory array 600. Depicted on the right side of FIG. 8 is a schematic representation of the fundamental elements of one of the vertical NAND strings 610 of the memory array 600. Similar to the NAND string 50 of FIG. 4A, the string 610 is comprised of a series of interconnected memory cells. The string 610 is connected to an associated bit line (BL) through a drain select gate (SGD). A source select gate (SDS) connects the string 610 to a global source line (SL) through an associated local source line (LI). Further included in this particular embodiment are several dummy cells located at the ends of the string 610. Due to their proximity to select gates (SGD, SDS) and, thereby, their susceptibility to disturbs, the dummy cells are not used to store user data.

Figure 9:
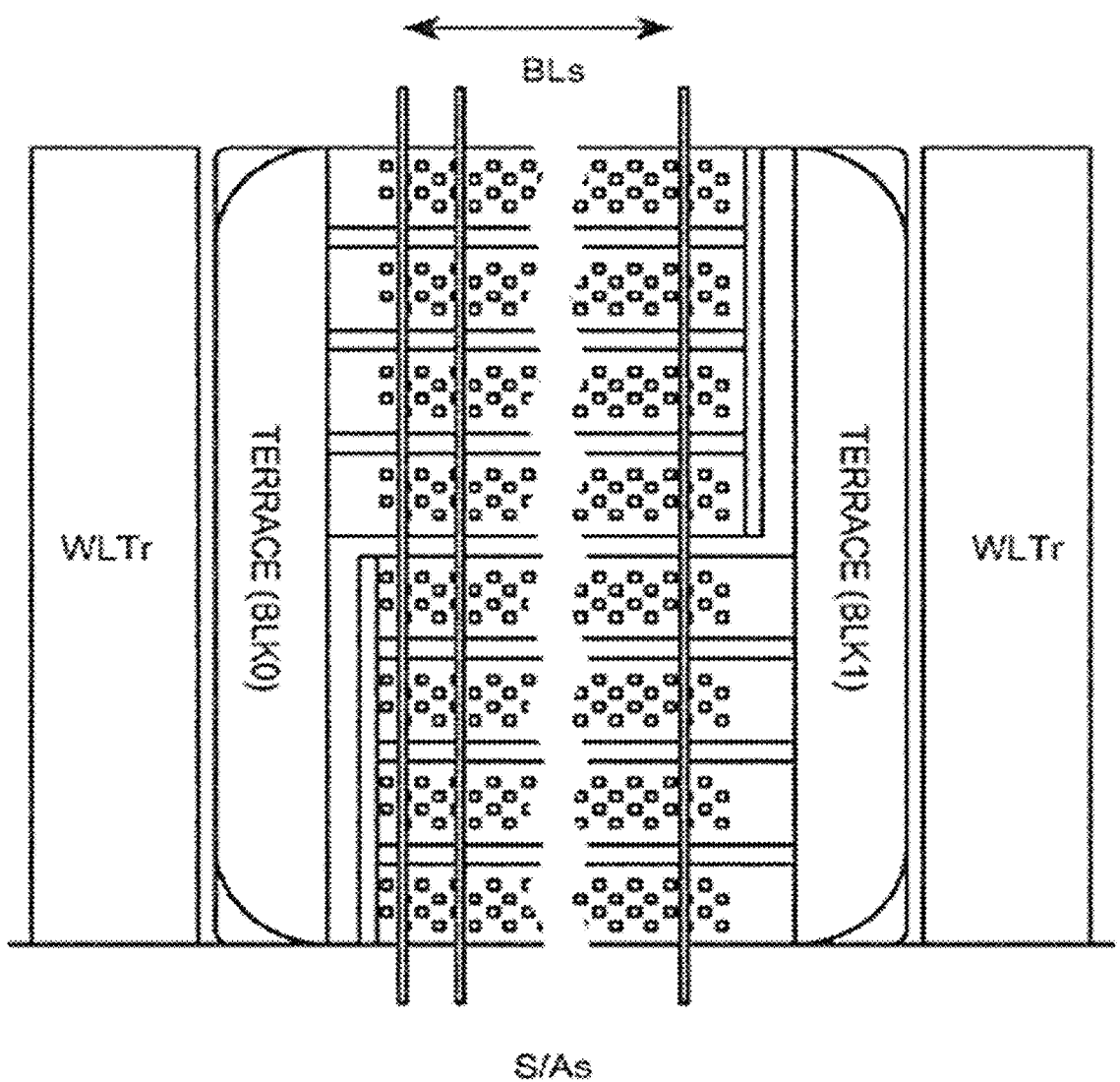
FIG. 9 is a top view of two representative blocks of the memory array of FIG. 8, in accordance with exemplary embodiments.

Turning to FIG. 9, there is shown a top view of two representative blocks (i.e., BLK0 and BLK1) of the array structure 600 of FIG. 8. According to this particular embodiment, each block is comprised of four extensions that extend from left to right. Further, the word lines and the select gate lines of each level also extend from left to right, wherein the word lines of the different extensions of the same block are commonly connected at a "terrace" from which they receive their various voltage levels by way of word line select gates (WLTr). It should also be noted that the word lines of a given layer of a block may be commonly connected on the far side from the terrace. Also, the selected gate lines can be individual, rather than common, for each level, thereby allowing for each extension to be individually selected. In addition, the bit lines (BLs) run vertically as depicted, and connect to the sense amplifier circuits (SAs) where, depending on the embodiment, each sense amplifier can correspond to a single bit line or be multiplexed to several bit lines.

Figure 10:
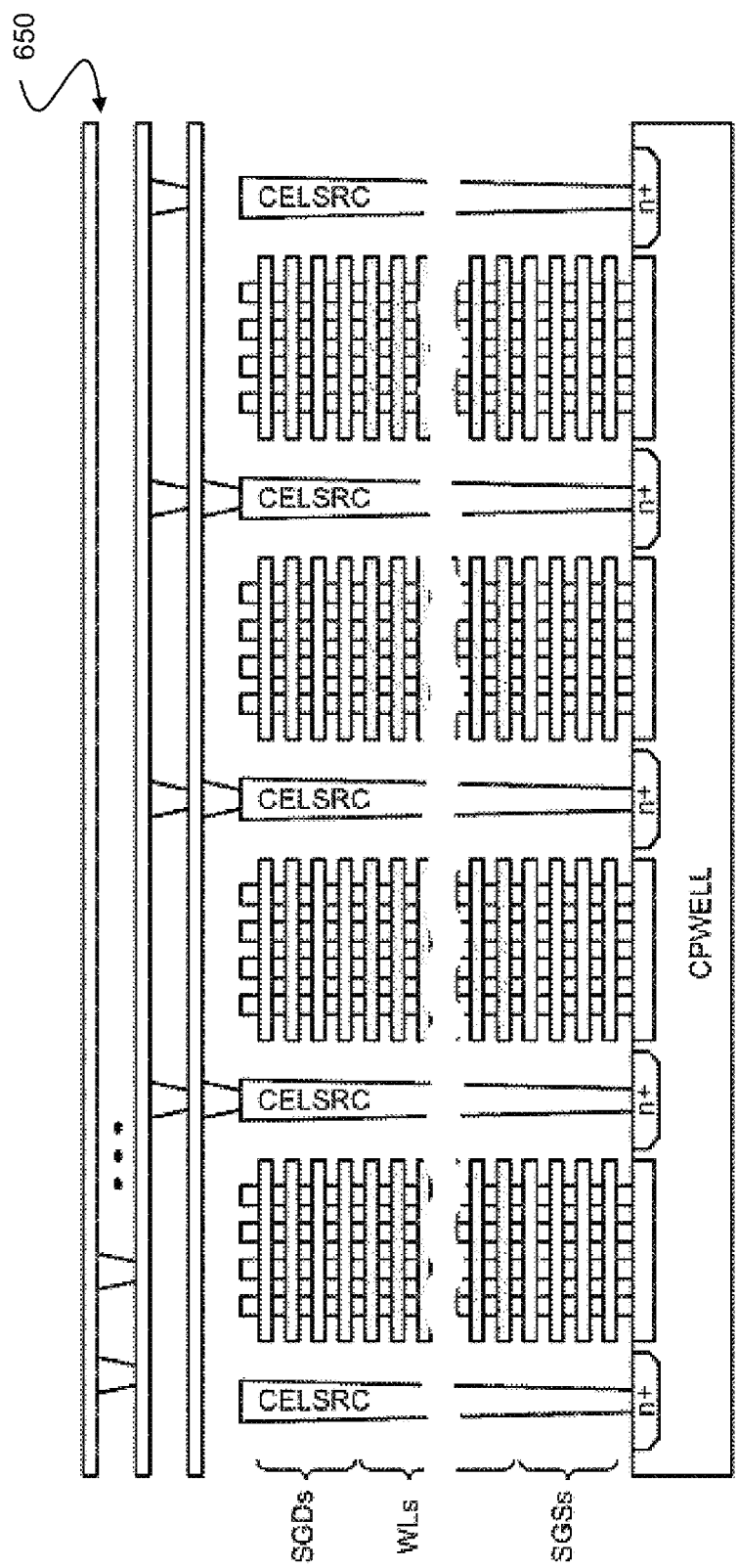
FIG. 10 is a side view of a representative block of the memory array of FIG. 8, in accordance with exemplary embodiments.

The side view that is provided in FIG. 10 shows the four extensions of an individual block 650 of the array structure 600 of FIG. 8 in greater detail. According to this particular embodiment, select gates (SGD, SDS) at either end of the NAND strings are formed with four layers, with the word lines (WLs) therebetween, all formed over a CPWELL. Accordingly, in order to select a given extension, the voltage level (VSG) of the select gates is set and the word lines (WLs) are biased according to the operation, either at a read voltage (VCGRV) for the selected word lines (WLs), or at a read-pass voltage (VREAD) for the non-selected word lines (WLs). The non-selected extensions may then be cut off by setting their select gates accordingly.

Figure 11A:
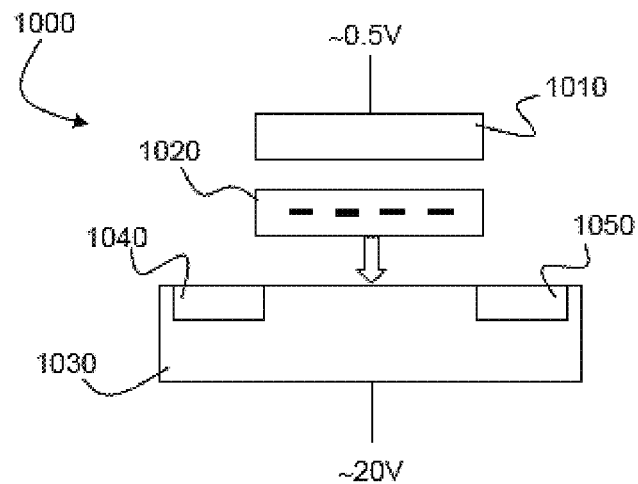
FIG. 11A is a diagrammatic illustration of a memory erase operation with respect to a programmable transistor of a two-dimensional memory structure, in accordance with exemplary embodiments.
Figure 11B:
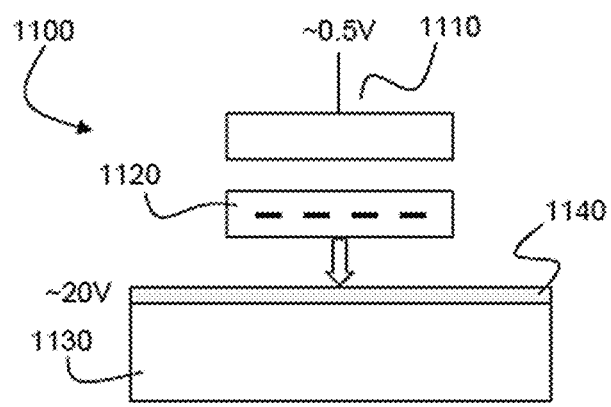
FIG. 11B is a diagrammatic illustration of a memory erase operation with respect to a programmable transistor of a three-dimensional memory structure, in accordance with exemplary embodiments.

Returning now to the programming and erase memory operations with respect to non-volatile memory, these two operations may be generally described in the following manner. As described above, each cell comprises a floating gate MOS transistor, wherein the floating gate (FG) is an electrically isolated conductor. Accordingly, when programming a memory cell, a relatively high voltage is applied to the control gate of the memory cell (in the case of a two-dimensional array) or the appropriate word line (WL) (in the case of a three-dimensional array) and, as a result, electrons are injected into the floating gate by means of, for example, Fowler-Nordheim (F-N) Tunneling. Data bits are then stored by trapping charge on the floating gate, wherein the logic value is defined by its threshold voltage and the amount of electrical charge stored. Conversely, to erase a memory cell, electrons in the floating gate are removed by, for example, a process referred to as quantum tunneling, to the source and/or the semiconductor substrate. More specifically, in some exemplary embodiments, electrons are removed from the charge trapping layer (i.e., floating gate) by applying a low voltage to the control gate and increasing the channel voltage to a high voltage, thereby creating an electric field that causes electrons to be pushed back into the semiconductor substrate. This process is diagrammatically illustrated in FIG. 11A, which generally depicts a two-dimensional NAND-type memory cell configuration 1000 comprising a control gate 1010, a floating gate 1020, and the underlying semiconductor substrate 1030 (e.g., polysilicon) comprising the memory cell's source and drain terminals (see 1040 and 1050, respectively). According to this particular embodiment, a relatively low voltage (0.5 V, for example) is applied to the control gate 1010 and a relatively high voltage VERA (20 V, for example) is applied to substrate body 1030, causing the electron charges (−) trapped at the floating gate 1020 to be pushed back into substrate 1030. Similarly, depicted in FIG. 11B is a diagrammatic view of a general erase process with respect to a three-dimensional NAND-type memory cell configuration 1100, according to an exemplary embodiment. Here, a relatively low voltage (e.g., ~0.5 V) is applied to the appropriate word line 1110 and a relatively high voltage VERA (e.g., ~20 V) is applied to a channel 1140 of the memory structure 1130, the channel being comprised of holes. As a result, the electron charges (−) are pushed out of the charge trapping layer 1120.

Figure 12:
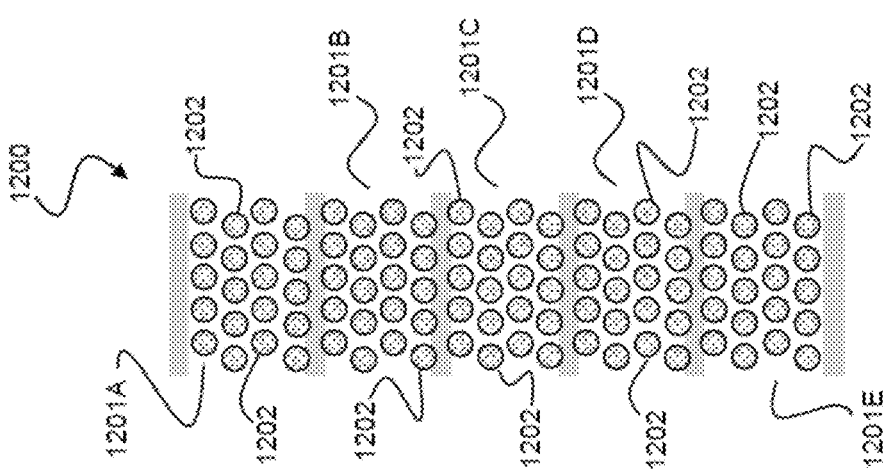
FIG. 12 is a top view of a vertical NAND-type string of a three-dimensional memory array, wherein the string exhibits a variable gate oxide thickness amongst its memory storage elements, in accordance with exemplary embodiments.

As mentioned above, these high storage density memory structures, such as the BiCS type described, for example, with respect to the embodiment depicted in FIGS. 8-10, have relatively small spacing between adjacent memory cells and each cell has a relatively small tolerance between discrete voltage ranges for memory functions. Accordingly, improving the amount of efficient storage capability within a fixed die size has competing drawbacks and liabilities. As previously mentioned, some challenges arise from the unintended structural variations occurring in the semiconductor materials comprising the memory structure as an intrinsic result of existing fabrication processes. For example, it is possible that, in a scalable memory structure, variations in the relative thicknesses of the gate oxide layers (e.g., $SiO_2$) between substructures of the memory (e.g., between memory cells, strings or blocks located in proximity to one another) may be encountered as an inherent development of the fabrication process. To illustrate this structural phenomenon in a general manner, FIG. 12 depicts the top view of a non-limiting example of a memory substructure 1200 within which this variable thickness condition might occur. In this particular example, the memory structure 1200 is a NAND-type structure of a three-dimensional memory array, wherein the substructure 1200 is comprised of five vertical memory cell strings (such as string 701 shown in FIG. 7), designated 1201A-1201E. As depicted, in this specific implementation, the stacked memory cells 1202 of each of the strings 1201A-1201E are arranged in an offset or staggered pattern to form, for example, a 20-memory cell staggered configuration. Under certain circumstances, the memory cells 1202 of the respective strings 1201A-1201E of this type of structure 1200 may, when examined, exhibit an increasingly thicker gate oxide as one moves from the outer strings (i.e., 1201A and 1201E) of the structure 1200 to the interior strings (i.e., 1201B to 1201D) of the structure such that memory cells 1202 of the innermost string (which is string 1201C in this example) exhibit the thickest gate oxide level amongst the memory cells 1202 of the structure 1200. The variation amongst the gate oxide thicknesses from the outermost to the innermost memory strings may be relatively substantial. Additionally, variations in the gate oxide thicknesses of the memory cells may exist between word lines (WL) of a memory structure as well. As a result, in a memory structure such as the type of memory structure 1200 depicted in FIG. 12, it may be possible, based upon observations and taking into account the relevant parameters and sources of possible thickness variations, that the memory structure could, according to this particular example, exhibit a total gate oxide thickness variation across the memory structure of approximately 2.4 nm. Thus, according to this particular example, by applying a Euclidean norm, one can predict or expect, as an overall worst case scenario, an approximate 1.4 nm variation in gate oxide thickness across the memory structure. Importantly, the thickness of the gate oxide of a memory cell is a determining factor in the magnitude of the electrical resistance that is characteristic of the memory cell, which in turn determines the magnitude of any applied biasing voltage necessary for performing a memory operation with respect to the threshold voltage ($V_{th}$) range of the memory cell. Accordingly, in a memory structure having variable or nonuniform thicknesses amongst its memory cells, it is distinctly problematic to apply a uniform biasing voltage to the entirety of the memory structure under a conventional biasing scheme without compromising the reliability of the memory operation. Therefore, in this context, a variation in gate oxide thickness within a memory structure at the magnitude described above (e.g., approximately 1.4 nm) is incredibly significant. This phenomenon of variations in gate oxide thickness amongst memory elements becomes more pronounced as the storage density increases, which is likely due to the close proximity between the memory cells and as a result of the thinner OM pitch employed. At focus in the following description are corrective mechanisms that harness this interrelationship or interdependence between the variations in the gate oxide thicknesses amid the storage elements of a memory structure and the associated nonuniform electrical resistances encountered as a result, by implementing a voltage biasing scheme during read and verify memory operations that is more tailored than the conventional or existing biasing schemes. More specifically, exemplary embodiments of the voltage biasing scheme described below involve individually assigning or calibrating by memory substructure (e.g., a memory cell string) a reading and verifying scheme and methodology that is determined by the condition of the gate oxide thickness specifically encountered at the memory substructure.

Figure 13:
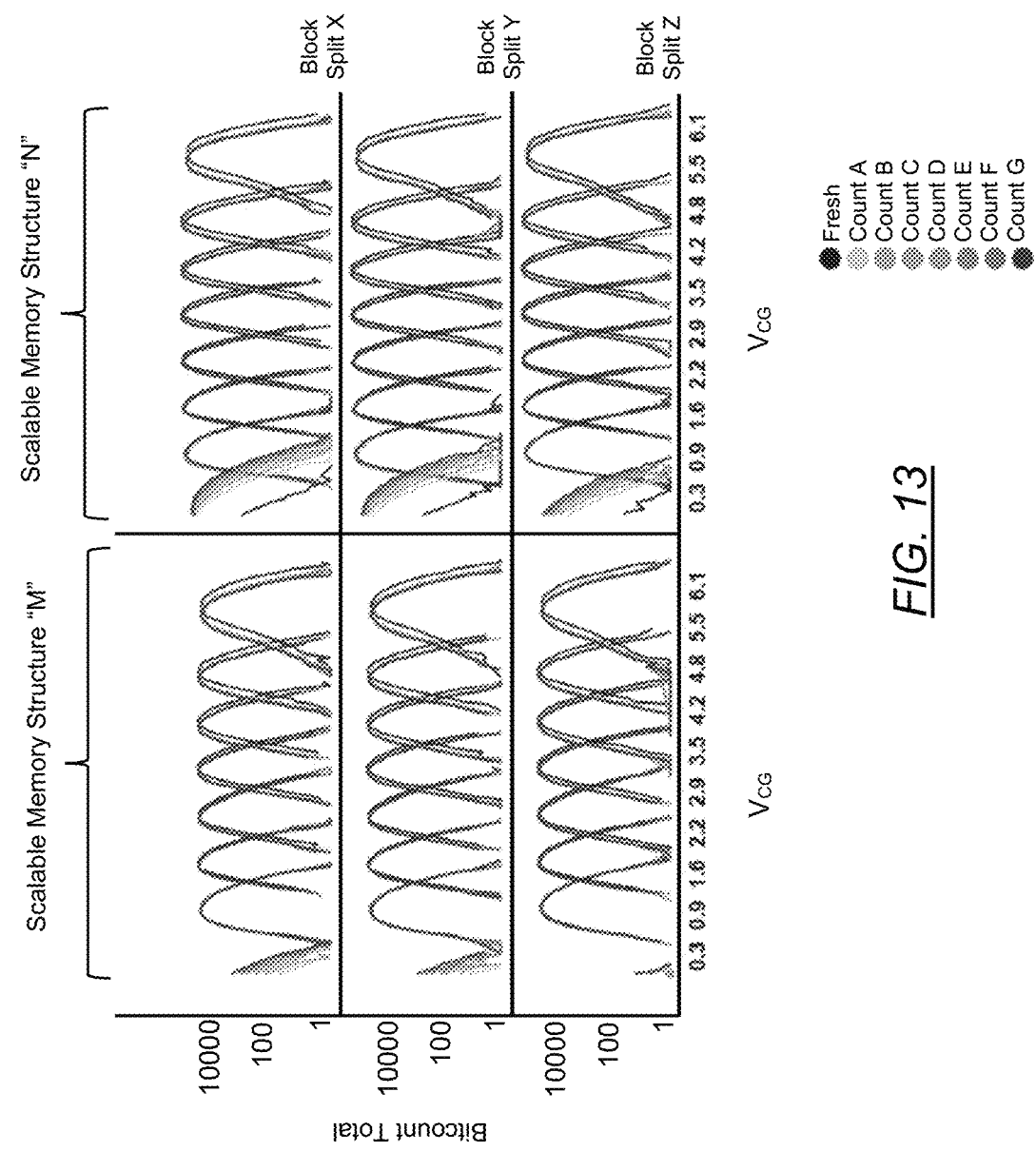
FIG. 13 is a chart providing a comparison of observational programming data of programmable states A through G of two example three-dimensional memory array structures, wherein one of the two memory structures has a shorter OM pitch than the second of the two memory structures, in accordance with exemplary embodiments.

In general terms, FIG. 13 provides an illustration of the observed effects on certain memory operations of a scalable memory structure as a consequence of variable gate oxide thicknesses within the memory structure, occurring to a greater extent in memory structures of shorter OM pitch, i.e., the proximity between memory cell to memory cell, or higher storage density. In this particular illustration, a comparison is depicted between two sets of memory program waveform data with respect to a TLC-type memory cell, indicating the programming states of A through G. The set of program data set forth on the right-hand side of FIG. 13 is associated with a scalable memory structure "N." The set of program data set forth on the left-hand side is associated with a scalable memory structure "M," wherein the scalable memory structure "M" has a shorter OM pitch than that of scalable memory structure "N." Additionally, the program waveform data in each set is produced with respect to three discrete splits of the silicon oxide block, referenced as splits "X," "Y," and "Z" in FIG. 13, wherein the block oxide thickness increases from split "X" to split "Z" (e.g., "X"=5.5 nm, "Y"=6.0 nm, and "Z"=6.5 nm). Furthermore, for both of memory structures "M" and "N", the program data provided is captured with respect to a fresh block such that the block has only been programmed once, as indicated by the black waveform (referenced as "Fresh" in FIG. 13) from an erase state. Accordingly, the other data waveforms are with respect to successive read count totals of the programmed block (labeled as "Count A, "Count B," etc., "Count G" in FIG. 13), such that the program data reflects only the read stress experienced by the memory structure and does not indicate any write/erase stress. The experienced read stress is isolated for purposes of the illustration in FIG. 13 due to the fact that, based upon observations, the read memory operation appears to be the operation that is most sensitive to changes in the resistivity amongst the block oxide and/or the word line(s). As clearly shown in FIG. 13, the erase state with respect to both memory structure "M" and memory structure "N" is highly dependent upon the block oxide thickness, wherein the erase state is more stable as the block oxide thickness increases and vice versa.

Figure 14:
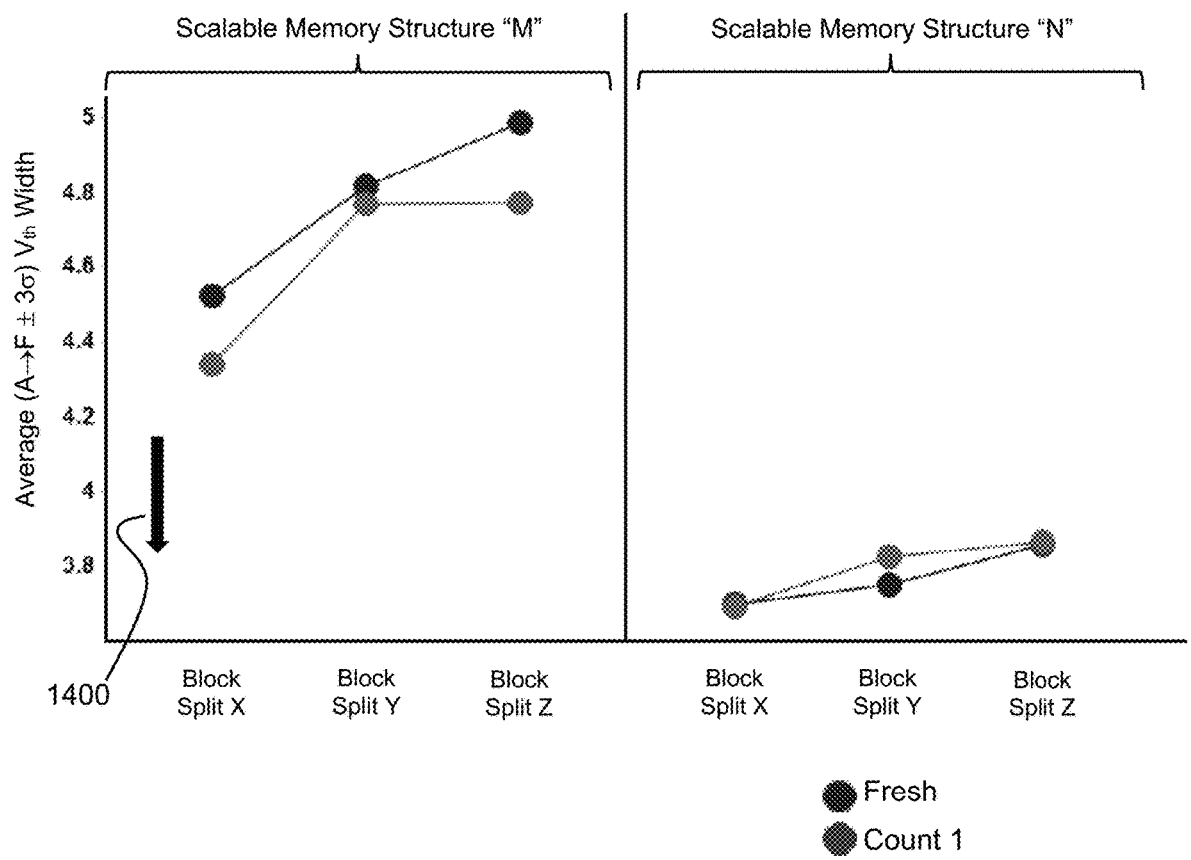
FIG. 14 is a chart providing a comparison of observational programming data with respect to the threshold voltage ($V_{th}$) distribution range of the two example memory structures examined in FIG. 13, in accordance with exemplary embodiments.

Referring now to FIG. 14, there is provided a different comparison between scalable memory structures "M" and "N" of FIG. 13, in order to illustrate a further observation regarding the connection between a variation in gate oxide thickness and the stability in the resolution or available voltage distribution range (i.e., "budget") with respect to the memory cell threshold voltage ($V_{th}$) of the memory structure. Again, the data is produced for the same three discrete block oxide splits "X," "Y," and "Z," that are identified in FIG. 13 for each of the memory structures "M" and "N." For each of the memory structures "M" and "N," the wave forces of programming states A through F are combined at each of the block oxide split thicknesses "X," "Y," and "Z," when the memory block is programmed only once (see the black data curve, referenced as "Fresh" in FIG. 14) and when the memory block has endured a certain number (referred to as "Count 1") of write and erase cycles (see the gray data curve in FIG. 14). As indicated, the memory structure having the shorter OM pitch, i.e., memory structure "M," has a wider threshold voltage ($V_{th}$) distribution range as compared to that of memory structure "N." However, in the case of both memory structures "M" and "N," the resolution or the available threshold voltage ($V_{th}$) distribution range improvingly tightens as the block oxide thickness becomes thinner (i.e., in the direction of the arrow 1400 in FIG. 14). Accordingly, the data measurements set forth in FIGS. 13 and 14 demonstrate that there is a problematic trade-off in which the thinner block oxide produces a better threshold voltage ($V_{th}$) resolution, which is a coveted performance objective or metric, but it also demonstrates a significant erase state instability.

Figure 15:
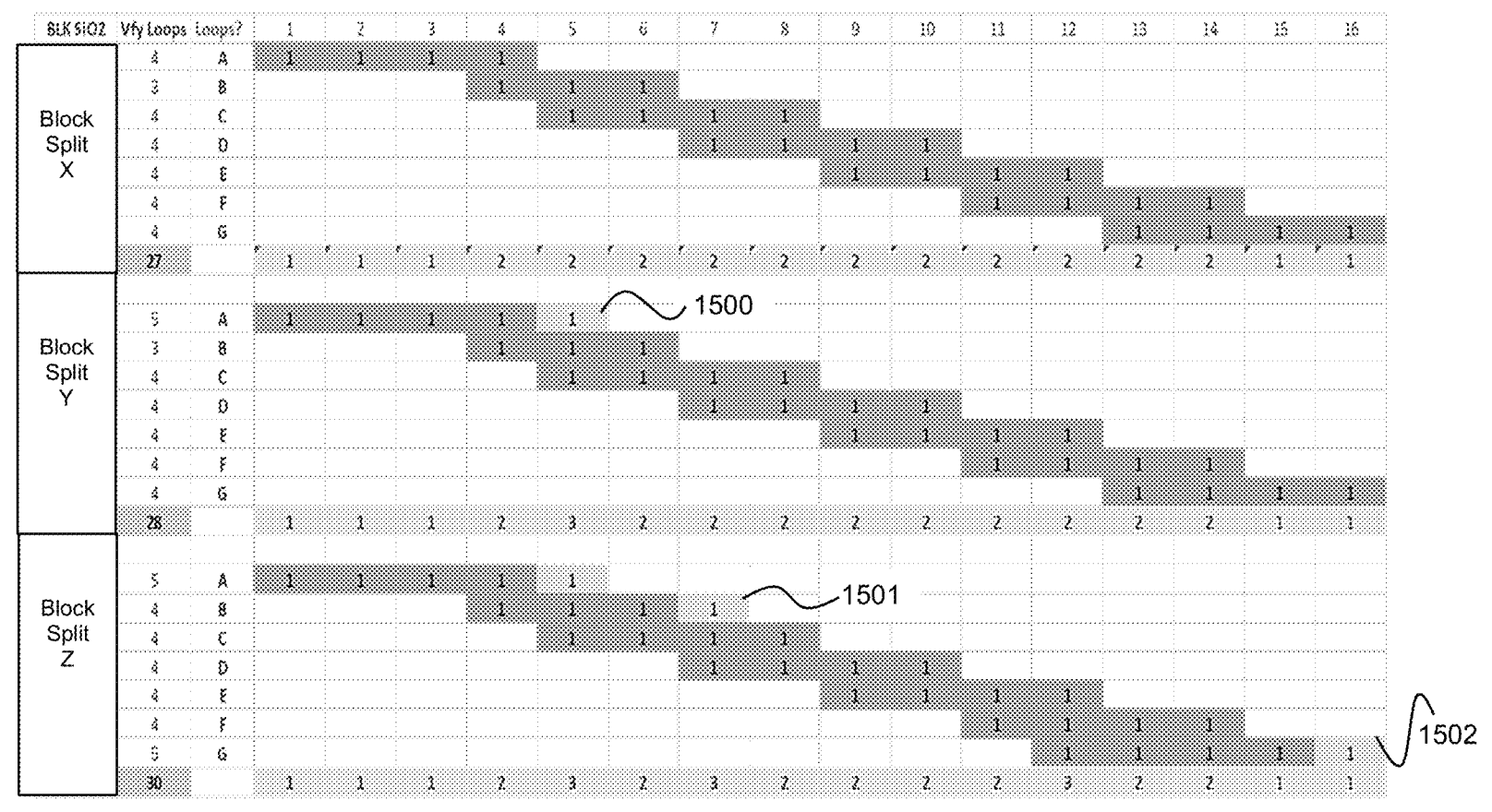

In further observations, the chart in FIG. 15 investigates the relationship between the variation in the block oxide thickness within a scalable memory structure and the programming speed. More specifically, FIG. 15 generally depicts, according to an exemplary set of data, the amount of programming and verifying that, according to certain observations, may be required depending upon the block oxide thickness within a memory structure. For the purposes of this particular data set, the same block oxide split thicknesses, "X," "Y," and "Z," examined in reference to the discussion of FIGS. 13 and 14 are again examined here. As shown, for each of the block oxide split thicknesses "X," "Y," and "Z" (wherein the thickness increases from thickness "X" to thickness "Z"), FIG. 15 indicates the number of programming and verification loops that may be required to confirm the programmed state in each of states A through G with respect to a memory block that has been programmed only once (and therefore, has not encountered any read and write/erase stress). As the block oxide thickness increases from the thickness "X" to the thickness "Y" (e.g., an increase of 0.5 nm), an additional verification loop 1500 may be required with respect to program state A. Further, as the block oxide thickness increases from the thickness "Y" to the thickness "Z" (e.g., an increase of 0.5 nm), added verification loops 1501 and 1502 may be required with respect to the program states B and G. Accordingly, generally speaking, any variations in the block oxide thickness within a memory structure influence the required number of verification loops and, therefore, the programming speed, whereby any increases in the block oxide thickness within a memory structure (as, for example, found to be an inherent structural condition in scalable memory structures such as the type depicted in FIG. 12), will increase the required number of verification loops and slow its programming speed. As mentioned above regarding the data analysis set forth in FIG. 14, a memory cell having a relatively thicker block oxide thickness will exhibit a wider threshold voltage ($V_{th}$) distribution range and, therefore, requires more (or higher) verify voltage levels in order to confirm all programmed states. As a result, memory cells having a thicker block oxide thickness are distinctly more difficult to program in comparison to memory cells of the same memory block structure having a thinner block oxide thickness.

Figure 16:
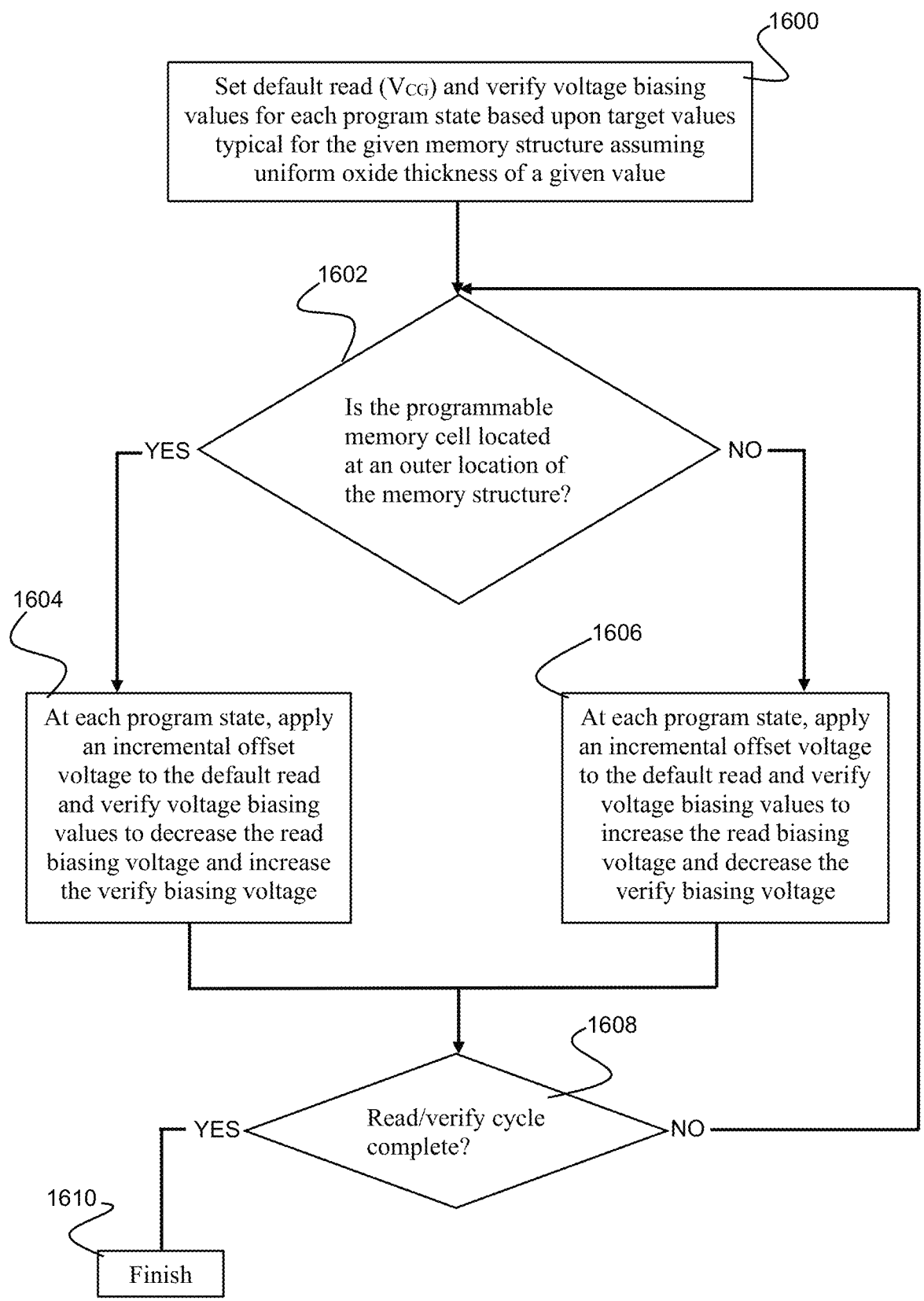
FIG. 16 is a flow diagram generally illustrating the steps of program verify and read operations of a target memory cell with adjusted verify and read voltage biasing levels that are dependent upon a location of the target memory cell within an exemplary three-dimensional memory structure, according to an exemplary embodiment.

Thus, based upon the observations or principles generally illustrated in FIGS. 13-15, evidently there is a dependence between any variations in the block oxide thickness within a memory structure and both the read and verify memory operations. In addition, there are competing considerations when evaluating certain performance ideals, such as the threshold voltage (Vth) resolution and erase stability, in which, for example, an area of relatively thinner block oxide thickness, when juxtaposed with an area of greater block oxide thickness, may be associated with a comparatively poorer performance according to one metric and yet also be associated with a comparatively better performance according to another metric. Given this awareness that areas of a memory structure that have a relatively thicker block oxide thickness might provide a greater erase stability but, conversely, are difficult to program, an effective mechanism for countering or compensating for varying block oxide thicknesses that may be present in a scalable memory structure will be a mechanism that, in view of the associated behavioral dependencies detailed above, can dynamically adapt or acclimate its read and verify voltage biasing scheme to the precise block oxide thickness condition that is encountered in individual areas of the memory structure such that, unlike in conventional biasing schemes, a single uniform read and verify voltage biasing scheme is not applied to the entire memory structure. More specifically, offset levels may be built into the read and verify voltage biasing scheme to accommodate the varying block oxide thickness condition(s) in a given memory structure, wherein the offset levels are predetermined and can be derived using a comparative technical data analysis of the memory operation performance at various block oxide thickness conditions of the memory structure, such as the analysis that is described above with respect to FIGS. 13-15. While the exact offset levels employed may differ amongst differing memory structures, configurations, and/or implementations, the flow diagram in FIG. 16 illustrates a general framework of a variable read and verify voltage biasing scheme according to one exemplary embodiment thereof, wherein the basic framework takes into account the technical observations evaluated with respect to FIGS. 13-15. Beginning at step 1600 in FIG. 16, it is important to initially start by setting default read ($V_{CG}$) and verify biasing voltage levels in accordance with target voltage levels that are typical or expected for a given memory structure assuming that the memory structure has a uniform block oxide thickness throughout the entire structure. By establishing the default voltage biasing levels, a point of reference is determined from which the offset values may then be generated. Continuing on to step 1602, once a programming memory operation is initiated, a determination is made as to whether or not an incremental offset should be applied to adjust the default read and verify biasing voltage levels based upon the location of the memory cell relative to the inner and the outer portions of the memory block structure. As described in detail above, in certain high density scalable memory structures, memory cells are inherently fabricated to have thinner block oxide thicknesses at the outer portions of the memory structure and an increasingly thicker block oxide thickness when approaching the middle of the memory structure. Therefore, for memory cells that are located within the outer portions of the memory structure, it can be assumed that those memory cells exhibit a relatively thinner block oxide thickness. As such, to accommodate for the read stress sensitivity and the instability in the erase state that is characteristic for a memory cell having a thinner block oxide thickness, an incremental offset is applied to each program state to increase the verify voltage level and decrease the read voltage biasing level relative to the default levels initially set (see step 1604 in FIG. 16). Conversely, for a memory cell that is not located at an outer position of the memory block structure and, thus, is assumed to have a relatively thicker block oxide thickness, an incremental offset is applied to each program state to tune down the verify voltage level and increase the read voltage biasing level (relative to the default levels determined at step 1600) in order to accommodate for the diminished threshold voltage ($V_{th}$) resolution that is characteristic for a memory cell having a thicker block oxide thickness, as well as to decrease the required number of verification loops, thereby improving the programming speed (see step 1606 in FIG. 16). Once a single read and/or verify operation cycle is complete with respect to all of the programmed states of the memory cell, this incremental adjustment process is complete (see steps 1608 and 1610 in FIG. 16). As a result of the incremental adjustment(s), a compromise between the operational behavior of the memory cells having a thinner block oxide thickness and the memory cells having a thicker block oxide thickness, although residing in the same memory structure, is achieved thereby producing an ideal and normalized programming performance.

It should be noted that although the general methodology set forth in FIG. 16 entails initially determining the default read and verify voltage biasing levels according to a predetermined value and subsequently incrementing the default values in respective directions for both memory cells that are located at an outer position of the memory structure as well as for memory cells that are located at an inner position of the memory structure, this is just one non-limiting example of the incremental adjustment approach described herein. For example, as depicted in FIG. 16-A, in another exemplary embodiment, the target read and verify voltage biasing values typically applied to a memory cell having a block oxide thickness found at the innermost (middle) location of the memory structure may be considered to be the preferential values for the default values (see step 1620 of FIG. 16-A) such that any of the incremental adjustment(s) to the default values are applied only to the memory cells having the relatively thinner block oxide thickness condition (i.e., are located at an outer position of the memory structure) (see steps 1604 and 1626 in FIG. 16-A). In a further example, in an opposite implementation from that shown in FIG. 16-A, FIG. 16-B depicts an additional exemplary embodiment of an approach in which the default read and verify voltage biasing values are predicated on target values that are typically applied to a memory cell having a block oxide thickness found at the outermost location of the memory structure and the incremental adjustment(s) are, therefore, only applied to the memory cells that have an increasingly thicker block oxide thickness (i.e., are located towards a middle position of the memory structure) (see steps 1640, 1606, and 1644 in FIG. 16-B). Accordingly, the exemplary embodiments shown in FIGS. 16-A and 16-B are intended to show that the starting point from which any incremental adjustments are made can be adjusted and, from any chosen starting point, the incremental adjustment(s) are correlated to memory cell location within the memory structure (i.e., are location-determinative), wherein the fundamental objective is to individually adjust read and verify voltage biasing values in order to normalize and stabilize the overall memory operation performance.

The above discussion is meant to be illustrative of the principles and various embodiments of the present invention. Numerous variations and modifications will become apparent to those skilled in the art once the above disclosure is fully appreciated, and may be employed without departing from the scope of the disclosure, limited only by any practical limitations related to the materials and physical principles of the devices that are described. It is intended that the following claims be interpreted to embrace all such variations and modifications.

What is claimed is:

1. A method for operating a non-volatile memory structure, comprising:
   defining a default read biasing voltage value and a default verify biasing voltage value for each program state of a target memory cell of a plurality of memory cells comprising the memory structure, the memory structure defining an outer location in which a gate oxide thickness is a first thickness and a middle location in which the gate oxide thickness is a second thickness greater than the first thickness, the default read biasing voltage value and the default verify biasing voltage value selected for one of the first thickness and the second thickness and an intermediate thickness between the first thickness and the second thickness;
   determining a location of the target memory cell within the memory structure; and
   based upon the determined location of the target memory cell:
      calculating an adjusted read biasing voltage equal to a first incremental offset voltage added to the default read biasing voltage value with respect to each program state; and
      calculating an adjusted verify biasing voltage equal to a second incremental offset voltage added to the default verify biasing voltage value with respect to each program state.

2. The method according to claim 1, wherein:
   the memory structure is a vertical three-dimensional NAND-type memory array comprising a plurality of memory strings, wherein the plurality of memory strings comprises cells having non-uniform gate oxide thicknesses;
   determining a location of the target memory cell within the memory structure comprises determining a string location of the target memory cell; and
   calculating the first incremental offset voltage and calculating the second incremental offset voltage is based upon the determined string location of the target memory cell, such that a read biasing voltage value and a verify biasing voltage value that is applied to a first string of the memory structure may be different than a read biasing voltage value and a verify biasing voltage value that is applied to a second string of the memory structure.

3. The method according to claim 2, wherein the default read biasing voltage value and the default verify biasing voltage value are target values typical for the memory structure when assuming a uniform gate oxide thickness amongst the plurality of memory cells.

4. The method according to claim 3, wherein the first incremental offset voltage decreases the default read biasing voltage value and the second incremental offset voltage increases the default verify biasing voltage value if the determined location of the target memory cell is at the outer location of the memory structure.

5. The method according to claim 3, wherein the first incremental offset voltage increases the default read biasing voltage value and the second incremental offset voltage decreases the default verify biasing voltage value if the determined location of the target memory cell is at the middle location of the memory structure.

6. The method according to claim 1, wherein a magnitude of the first incremental voltage offset is ±0.0125 V.

7. The method according to claim 1, wherein a magnitude of the second incremental voltage offset is ±0.0125 V.

8. The method according to claim 2, wherein the default read biasing voltage value and the default verify biasing voltage value are target values typical for the memory structure when assuming the gate oxide thickness of a thickness at the middle location of the memory structure.

9. The method according to claim 8, wherein the first incremental offset voltage decreases the default read biasing voltage value and the second incremental offset voltage increases the default verify biasing voltage value if the determined location of the target memory cell is at the outer location of the memory structure.

10. The method according to claim 8, wherein no incremental offset voltage is applied if the determined location of the target memory cell is at the middle location of the memory structure.

11. A memory controller, comprising:
a first port configured to couple to a non-volatile memory structure, the memory structure comprising at least one vertical three-dimensional NAND-type memory array having a target memory cell amongst a plurality of memory cells having non-uniform gate oxide thicknesses, the memory structure defining an outer location in which the gate oxide thickness is a first thickness and a middle location in which the gate oxide thickness is a second thickness greater than the first thickness; and
the memory controller configured to:
define a default read biasing voltage value and a default verify biasing voltage value for each program state of the target memory cell, the default read biasing voltage value and the default verify biasing voltage value selected for one of the first thickness and the second thickness and an intermediate thickness between the first thickness and the second thickness;
determine a location of the target memory cell within the memory array; and
based upon the determined location of the target memory cell:
calculate an adjusted read biasing voltage equal to a first incremental offset voltage added to the default read biasing voltage value with respect to each program state; and
calculate an adjusted verify biasing voltage equal to a second incremental offset voltage added to the default verify biasing voltage value with respect to each program state.

12. The memory controller according to claim 11, wherein the default read biasing voltage value and the default verify biasing voltage value are target values typical for the memory structure when assuming a uniform gate oxide thickness amongst the plurality of memory cells.

13. The memory controller according to claim 12, wherein the first incremental offset voltage decreases the default read biasing voltage value and the second incremental offset voltage increases the default verify biasing voltage value if the determined location of the target memory cell is at the outer location of the memory structure.

14. The memory controller according to claim 12, wherein the first incremental offset voltage increases the default read biasing voltage value and the second incremental offset voltage decreases the default verify biasing voltage value if the determined location of the target memory cell is at the middle location of the memory structure.

15. The memory controller according to claim 11, wherein a magnitude of the first incremental voltage offset and the second incremental voltage offset is ±0.0125 V.

16. A non-volatile memory system, comprising:
a memory structure that comprises at least one vertical three-dimensional NAND-type memory array having a target memory cell amongst a plurality of memory cells having non-uniform gate oxide thicknesses, the memory structure defining an outer location in which the gate oxide thickness is a first thickness and a middle location in which the gate oxide thickness is a second thickness greater than the first thickness; and
a memory controller coupled to the memory structure and:
defining a default read biasing voltage value and a default verify biasing voltage value for each program state of the target memory cell, the default read biasing voltage value and the default verify biasing voltage value selected for one of the first thickness and the second thickness and an intermediate thickness between the first thickness and the second thickness;
determining a location of the target memory cell within the memory array; and
based upon the determined location of the target memory cell:
calculating an adjusted read biasing voltage equal to a first incremental offset voltage added to the default read biasing voltage value with respect to each program state; and
calculating an adjusted verify biasing voltage equal to a second incremental offset voltage added to the default verify biasing voltage value with respect to each program state.

17. The non-volatile memory system according to claim 16, wherein the default read biasing voltage value and the default verify biasing voltage value are target values typical for the memory array when assuming a uniform gate oxide thickness amongst the plurality of memory cells.

18. The non-volatile memory system according to claim 17, wherein the first incremental offset voltage decreases the default read biasing voltage value and the second incremental offset voltage increases the default verify biasing voltage value if the determined location of the target memory cell is at the outer location of the memory array.

19. The non-volatile memory system according to claim 17, wherein the first incremental offset voltage increases the default read biasing voltage value and the second incremental offset voltage decreases the default verify biasing voltage value if the determined location of the target memory cell is at the middle location of the memory structure.

20. The non-volatile memory system according to claim 16, wherein a magnitude of the first incremental voltage offset and the second incremental voltage offset is ±0.0125 V.

* * * * *